United States Patent
Min et al.

(10) Patent No.: US 11,018,629 B2
(45) Date of Patent: May 25, 2021

(54) INTEGRATED MULTIPLE-PATH POWER AMPLIFIER

(71) Applicant: NXP USA, Inc., Austin, TX (US)

(72) Inventors: Seungkee Min, Chandler, AZ (US); Margaret A. Szymanowski, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 133 days.

(21) Appl. No.: 16/449,994

(22) Filed: Jun. 24, 2019

(65) Prior Publication Data

US 2020/0403576 A1 Dec. 24, 2020

(51) Int. Cl.
*H03F 3/68* (2006.01)
*H03F 1/02* (2006.01)
(Continued)

(52) U.S. Cl.
CPC ......... *H03F 1/0288* (2013.01); *H01L 23/528* (2013.01); *H01L 23/66* (2013.01); *H01L 24/05* (2013.01); *H01L 24/48* (2013.01); *H01L 24/85* (2013.01); *H01L 27/0207* (2013.01); *H01L 27/0629* (2013.01); *H01L 28/10* (2013.01); *H01L 28/40* (2013.01); *H03F 1/565* (2013.01); *H03F 3/213* (2013.01); *H01L 2223/6611* (2013.01); *H01L 2223/6627* (2013.01); *H01L 2224/04042* (2013.01);
(Continued)

(58) Field of Classification Search
CPC .............................. H03F 1/0288; H03F 3/68
USPC ....................................................... 330/295
See application file for complete search history.

(56) References Cited

U.S. PATENT DOCUMENTS 7,078,976 B2   7/2006  Blednov
8,487,703 B2   7/2013  Blednov
(Continued)

FOREIGN PATENT DOCUMENTS

EP         3160042 A1    4/2017

OTHER PUBLICATIONS

Lin, Liang et al., "A 10W Fully-Integrated LDMOS MMIC Doherty in LGA Package for 2.7GHz Small Cell Application", 2019 IEEE MTT-S International Microwave Symposium, Jun. 2, 2019, pp. 1434-1437, IEEE, Piscataway, NJ, USA.

*Primary Examiner* — Steven J Mottola
(74) *Attorney, Agent, or Firm* — Sherry W. Schumm

(57) ABSTRACT

A multiple-path amplifier (e.g., a Doherty amplifier) includes a first transistor (e.g., a main amplifier FET), a second transistor (e.g., a peaking amplifier FET), a combining node, and a shunt-inductance circuit. The first and second amplifiers and the combining node structure are integrally-formed with a semiconductor die, and the shunt-inductance circuit is integrated with the die. Outputs of the first and second transistors are electrically coupled to the combining node structure. The shunt-inductance circuit is electrically coupled between the combining node structure and a ground reference node. The shunt-inductance circuit includes a shunt inductance (e.g., including wirebond(s) and/or spiral inductor(s)) that is integrated with the semiconductor die. The multiple-path amplifier also may include an integrated phase shifter/impedance inverter coupled between the outputs of the first and second transistors, and which is configured to impart a 90-degree phase delay between intrinsic drains of the first and second transistors.

22 Claims, 5 Drawing Sheets

(51) Int. Cl.
    *H01L 23/528*     (2006.01)
    *H01L 23/66*      (2006.01)
    *H01L 23/00*      (2006.01)
    *H01L 27/02*      (2006.01)
    *H01L 27/06*      (2006.01)
    *H01L 49/02*      (2006.01)
    *H03F 1/56*       (2006.01)
    *H03F 3/213*      (2006.01)

(52) U.S. Cl.
    CPC ............... *H01L 2224/4813* (2013.01); *H01L 2224/48091* (2013.01); *H01L 2224/48108* (2013.01); *H01L 2224/48153* (2013.01); *H03F 2200/318* (2013.01); *H03F 2200/423* (2013.01); *H03F 2200/451* (2013.01); *H03F 2200/552* (2013.01)

(56) References Cited

U.S. PATENT DOCUMENTS

| | | |
|---|---|---|
| 9,503,030 B2 | 11/2016 | Blednov |
| 9,509,252 B2 | 11/2016 | Moronval et al. |
| 9,543,914 B2 | 1/2017 | Bouny |
| 9,577,585 B2 | 2/2017 | Moronval et al. |
| 9,621,115 B1 * | 4/2017 | Wu ................ H03F 3/211 |
| 2016/0285418 A1 * | 9/2016 | Jones .............. H03F 3/195 |
| 2017/0005620 A1 * | 1/2017 | Hallberg ........... H03F 1/0288 |
| 2018/0175802 A1 | 6/2018 | Wu et al. |

* cited by examiner

INTEGRATED MULTIPLE-PATH POWER AMPLIFIER

TECHNICAL FIELD

Embodiments of the subject matter described herein relate generally to multiple-path power amplifiers, and more particularly to multiple-path power amplifiers with output combining circuits.

BACKGROUND

For many years, the Doherty power amplifier (PA) has been one of the most popular amplifiers for cellular infrastructure applications. Because the Doherty PA is well suited to amplifying signals with high peak-to-average power ratios (PAPRs), the prolific use of the Doherty PA is expected to continue for upcoming 5G infrastructure deployments. However, although the Doherty PA has been used for many years, conventional Doherty PA configurations are not able to meet some of the new challenges associated with 5G deployments. These challenges include supporting communications over increasingly broad bandwidths using low-cost and increasingly-compact amplifier equipment, all while meeting stringent RF performance requirements regarding linearity, efficiency and power gain.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
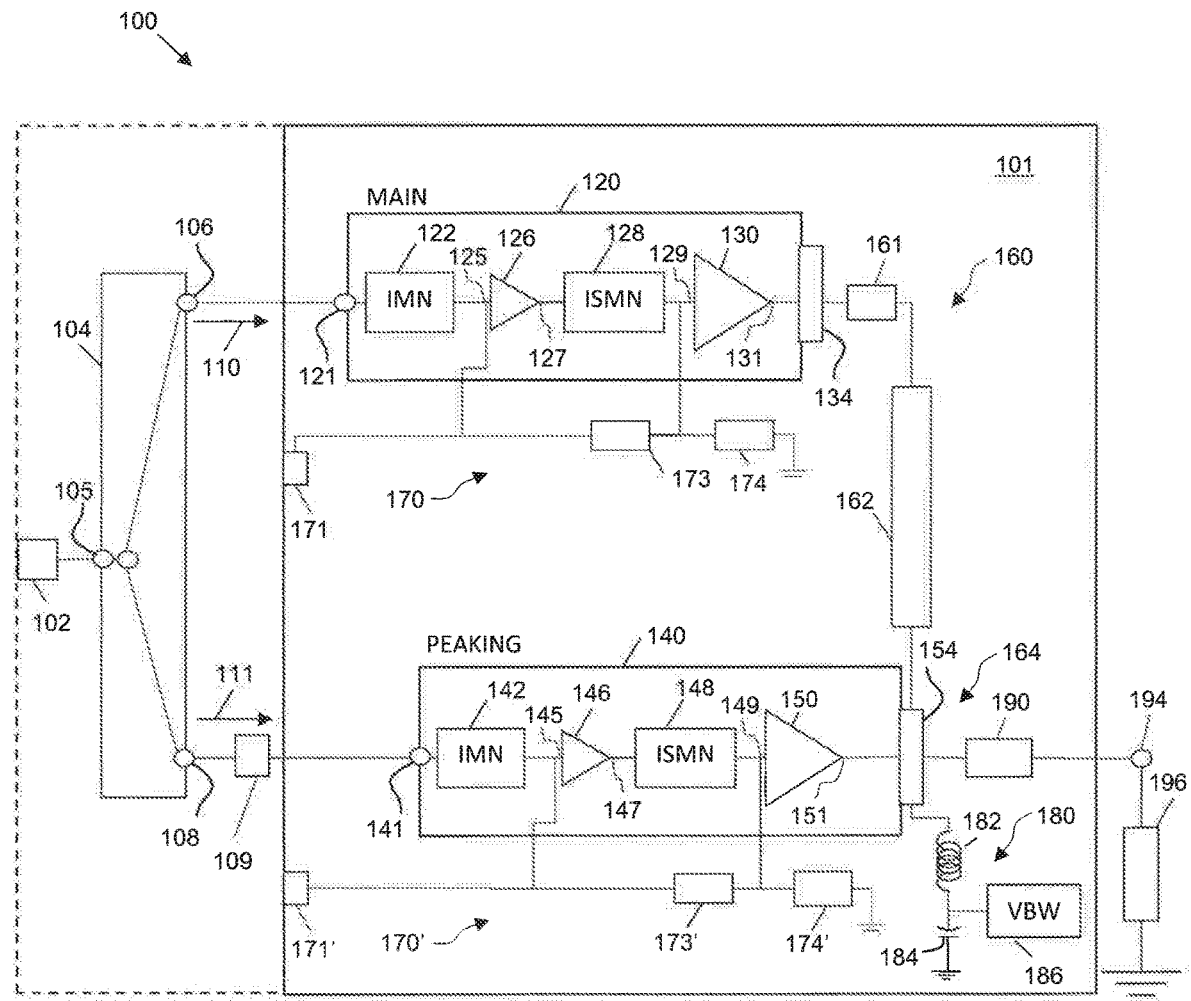
FIG. 1 is a simplified schematic of an integrated Doherty power amplifier, in accordance with an example embodiment.

In some typical conventional Doherty amplifiers, distinct semiconductor dies used for the main and peaking amplifiers are packaged in a discrete power amplifier device, and the discrete power amplifier device is coupled to a printed circuit board (PCB) that includes other portions of the Doherty amplifier. For example, an input splitter on the PCB is used to divide an input radio frequency (RF) signal into main and peaking input signals, and the main and peaking input signals are supplied to the main and peaking amplifiers through input leads of the power amplifier device. On the output side of the Doherty amplifier, amplified main and peaking signals are provided by the power amplifier device through separate output leads. Depending on whether the Doherty amplifier has a non-inverted or an inverted configuration, a phase shifter and impedance inverter is coupled to the PCB along the main or peaking output paths. After the phase shifter/impedance inverter, the amplified main and peaking signals are combined together by a Doherty combiner implemented on the PCB. In a mass production environment, various performance issues arise for conventional Doherty amplifiers due to placement tolerances for main and peaking power amplifier dies, variation in wirebond lengths and heights within the devices, and variations in the structures used to implement the phase shifter/impedance inverter and the combiner at the PCB level.

Embodiments of the inventive subject matter include a monolithic multiple-path amplifier, and in more specific embodiments, a monolithic Doherty power amplifier, with integrated first and second (e.g., main and peaking) power transistors, an integrated phase shifter/impedance inverter, and an integrated signal combiner connected between the outputs (e.g., drain terminals) of the first and second power transistors. More specifically, the phase shifter/impedance inverter and the signal combiner are implemented with conductive structures that are integrated with the same die as the first and second power transistors. As used herein, the term "monolithic" means integrated with or within a single semiconductor die (e.g., die 201, 301, FIGS. 2-4). When a component is referred to herein as being "integrally-formed" with a die (e.g., die 201, 301, FIGS. 2-4), this means that the component structure forms a portion of the die itself (e.g., the component is created during the die fabrication process, and is physically located between the top and bottom surfaces of the die). For example, referring briefly to FIGS. 2-4, FETs 226, 230, 246, 250, inductors 282', 282", and capacitor 284 are considered to be "integrally-formed" with die 201, 301. In contrast, when a component is referred to as being "integrated" with a die, this means that the component structure either is "integrally-formed" with the die, or the component is attached to the die (e.g., to the surface of die 201, 301) in a self-contained manner. For example, the sets of wirebonds 261, 282 (where "set" means one or more) are considered to be "integrated" with die 201, 301, as that term is used herein, because each wirebond in the sets of wirebonds 261, 282 launch and land on the top surface of the die 201, 301 (i.e., both ends of each wirebond are bonded to different bonding pads on the die top surface, and thus each wirebond is "self-contained" within the die 201, 301). In contrast, the sets of wirebonds 219, 290 are not considered to be "integrated" with die 201, 301, because the wirebonds in the sets of wirebonds 219, 290 do not launch and land on the die 201, 301 (i.e., only one end of each wirebond is bonded to a bonding pad on the die top surface). In addition, discrete components coupled to the top surface of a die also are considered to be "integrated" with the die (e.g., passive or active components that are discretely packaged with input and output terminals that are physically and electrically attached to bondpads exposed at the surface of a die, such as with solder or conductive adhesive).

As mentioned above, an embodiment of a Doherty amplifier includes an integrated signal combiner (or combining node structure) connected between outputs of main and peaking power transistors. In some embodiments, the signal combiner is closely electrically coupled to the drain terminal of the peaking transistor, where "closely electrically coupled," as used herein, means directly connected or electrically coupled through one or more conductive features (e.g., integrated conductive trace(s) or via(s)) that form a conductive path which has a negligible total electrical resistance (e.g., less than 5.0 ohms-20 ohms) and which is devoid of passive or active electrical components (e.g., discrete or integrated resistors, inductors, capacitors, or transistors). Because the signal combiner may be implemented very close to the intrinsic drain(s) of the peaking amplifier(s), a 90-0 Doherty amplifier may be achieved. The 90-degree phase difference between the main and peaking amplifier outputs is provided by a simulated quarter wave transmission line having a CLC topology. The CLC topology includes the drain-source capacitances of the main and peaking transistors, in combination with a tightly-controllable inductance implemented between the main amplifier output and the Doherty combining structure. In addition, according to various embodiments, implementation of an on-die shunt-inductance (or shunt-L) circuit may effectively compensate for the otherwise potentially performance-limiting, parasitic drain-source capacitance of the peaking amplifier transistor.

Further still, the various embodiments may significantly reduce or eliminate device-to-device production variation associated with die placement, and also may enable reductions in wirebond length and height variations. Accordingly, implementation of the various embodiments may enable Doherty amplifiers with more consistent RF performance to be produced.

The below-described and illustrated embodiments of Doherty amplifier ICs correspond to two-way Doherty amplifiers that include a main amplifier and one peaking amplifier. Although not explicitly illustrated, other embodiments may include "N-way" Doherty power amplifiers, where N>2, and in which the number of peaking amplifiers equals N−1. In addition, although the below-described example embodiments specifically pertain to embodiments of Doherty power amplifiers, the inventive subject matter may more generally apply to any type of multiple-path amplifier that may benefit from implementation of the inventive circuits and structures described herein. Therefore, the inventive subject matter is not limited to application only in Doherty power amplifiers.

FIG. 1 is a simplified schematic of a multiple-path Doherty power amplifier 100, in accordance with an example embodiment. Doherty amplifier 100 includes an input node 102, an output node 194, a power splitter 104 (or divider), a main amplification path 110, a peaking amplification path 111, a phase shifter/impedance inverter 160, a combining node structure 164, and an output shunt-L circuit 180. A load 196 may be coupled to the combining node structure 164 (e.g., through inductance 190 and output node 194) to receive an amplified RF signal from amplifier 100.

Figure 2:
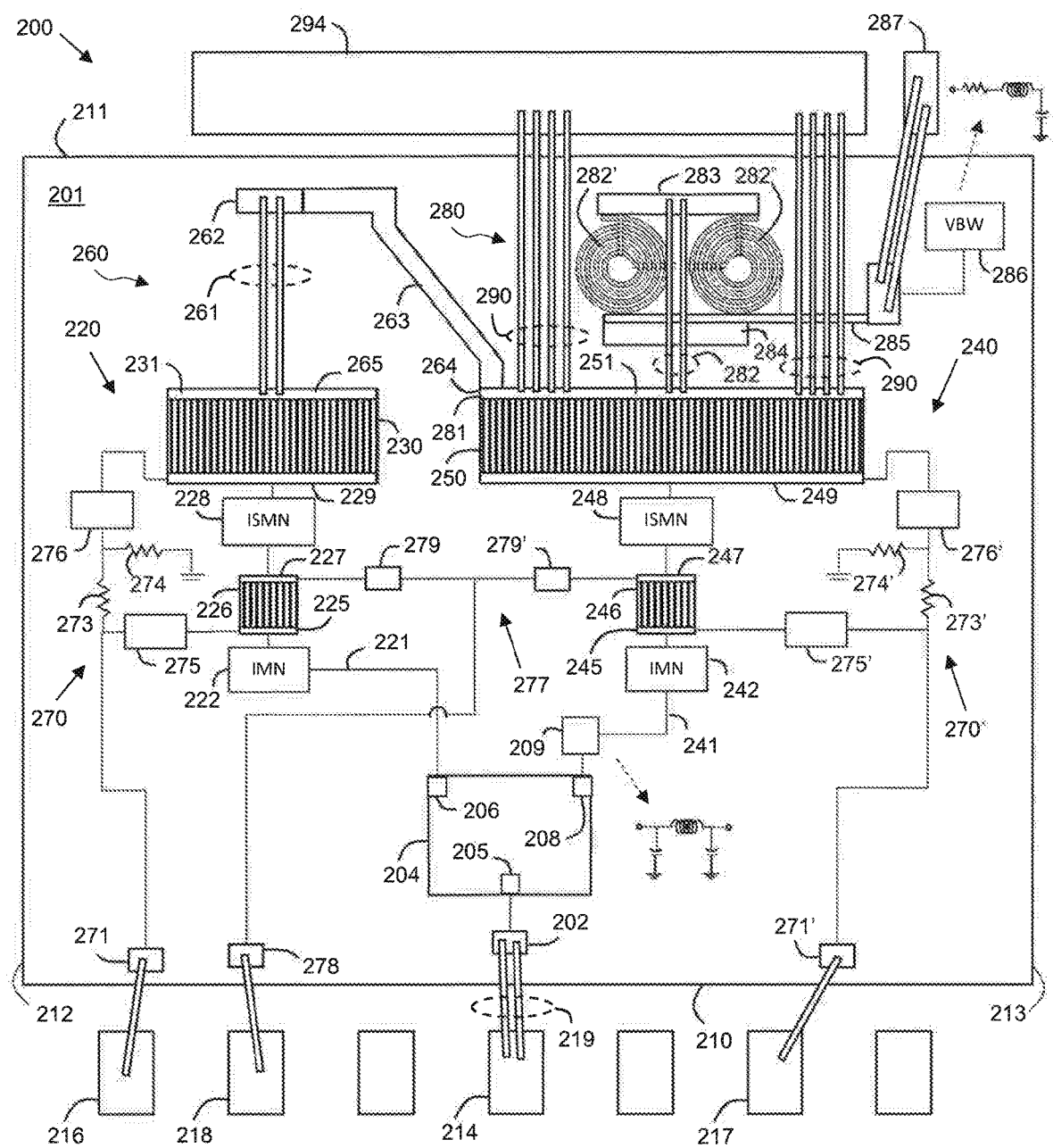
FIG. 2 is a top view of a Doherty power amplifier integrated circuit (IC), in accordance with an example embodiment.
Figure 3:
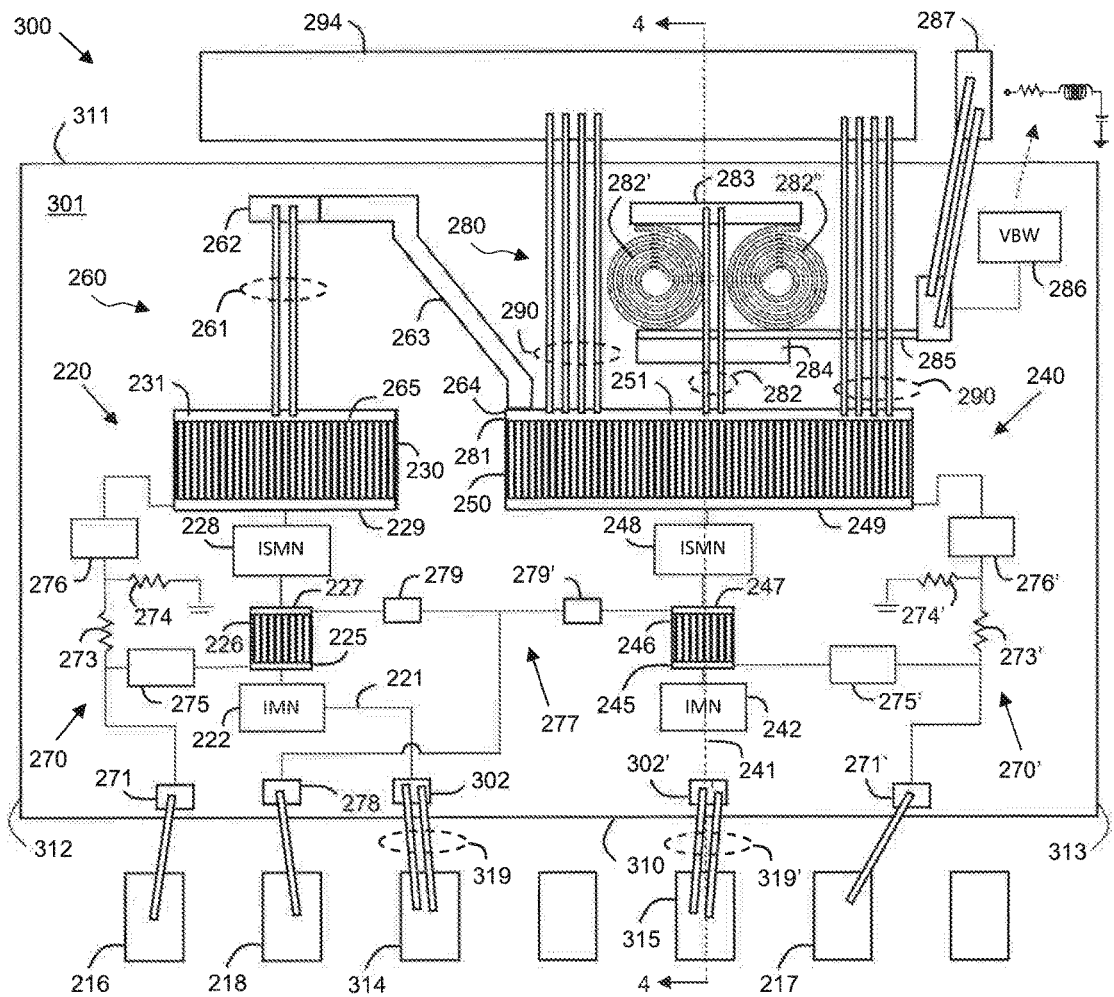
FIG. 3 is a top view of a Doherty power amplifier IC, in accordance with another example embodiment.
Figure 4:
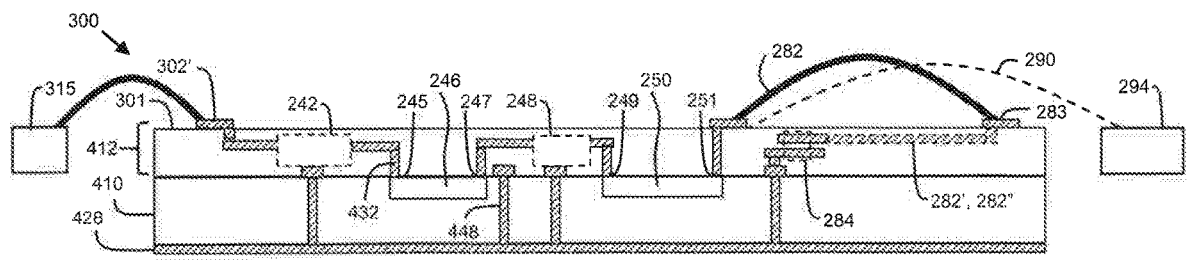
FIG. 4 is a side, cross-sectional view of the Doherty amplifier IC of FIG. 3 along line 4-4, in accordance with an example embodiment.

According to an embodiment, at least the main amplification path 110, peaking amplification path 111, phase shifter/impedance inverter 160, and combining node structure 164 are integrated with or within a single integrated circuit die 101 (i.e., the circuitry is monolithic). In some further embodiments, the output shunt-L circuit 180 also is integrated with the die 101. As depicted in FIGS. 3 and 4, discussed later, the power splitter 104 may be implemented off-die, in some embodiments, as indicated by the solid rectangular box that excludes power splitter 104, but encloses the amplification paths 110, 111, phase shifter/impedance inverter 160, and combining node structure 164. In such embodiments, the outputs 106, 108 of the power splitter 104 may be electrically connected to main and peaking path inputs 121, 141, respectively. In other embodiments, and as depicted in FIG. 2, discussed later, the power splitter 104 (e.g., power splitter 204, FIG. 2) alternatively may be integrated with the die 101 with the amplification paths 110, 111, phase shifter/impedance inverter 160, and combining node structure 164, as indicated by the dashed rectangular box enclosing the power splitter 104.

Doherty power amplifier 100 is considered to be a "two-way" Doherty power amplifier, which includes one main amplifier 120 and one peaking amplifier 140. The main amplifier 120 provides amplification along the main amplification path 110, and the peaking amplifier 140 provides amplification along the peaking amplification path 111. In other embodiments, more than one peaking amplifier may be implemented in parallel with the first peaking amplifier 140 to produce an N-way Doherty power amplifier, where N>2.

Although the main and peaking amplifiers 120, 140 may be of equal size (e.g., in a symmetric Doherty configuration with a 1:1 main-to-peaking size ratio), the main and peaking amplifiers 120, 140 may have unequal sizes, as well (e.g., in various asymmetric Doherty configurations). In an asymmetric two-way Doherty amplifier configuration, the peaking power amplifier 140 typically is larger than the main power amplifier 120 by some multiplier. For example, the peaking power amplifier 140 may be twice the size of the main power amplifier 120 so that the peaking power amplifier 140 has twice the current carrying capability of the main power amplifier 120. Asymmetric main-to-peaking amplifier size ratios other than a 1:2 ratio may be implemented, as well.

Power splitter 104 is configured to divide the power of an input RF signal received at input node 102 into main and peaking portions of the input signal. The main input signal is provided to the main amplification path 110 at power splitter output 106, and the peaking input signal is provided to the peaking amplification path 111 at power splitter output 108. During operation in a low-power mode when only the main amplifier 120 is supplying current to the load 196, the power splitter 104 provides the input signal power only to the main amplification path 110. During operation in a full-power mode when both the main and peaking amplifiers 120, 140 are supplying current to the load 196, the power splitter 104 divides the input signal power between the amplification paths 110, 111.

Power splitter 104 may divide the power of the input RF signal equally or unequally. For example, when Doherty amplifier 100 has an asymmetric Doherty amplifier configuration in which the peaking amplifier 140 is approximately twice the size of the main amplifier 120 (i.e., the Doherty amplifier 100 has an asymmetric configuration with a 1:2 main-to-peaking size ratio), the power splitter 104 may divide the power such that roughly one third of the input signal power is provided to the main amplification path 110, and roughly two thirds of the input signal power is provided to the peaking amplification path 111. In other words, with a 1:2 main-to-peaking size ratio, the size of the peaking amplifier 140 is about twice the size of the main amplifier 120, and the power splitter 104 is configured to produce a peaking input signal with about twice the power of the main input signal.

Alternatively, in the case of a symmetric Doherty amplifier configuration (i.e., the main-to-peaking size ratio is about 1:1), the power splitter 104 may divide the power so that about half of the input signal power is provided to the main amplification path 110 at power splitter output 106, and about half of the input signal power is provided to the peaking amplification path 111 at power splitter output 108.

Essentially, the power splitter 104 divides an input RF signal supplied at the input node 102, and the divided signals are separately amplified along the main and peaking amplification paths 110, 111. The amplified signals are then combined in phase at the combining node structure 164. It is important that phase coherency between the main and peaking amplification paths 110, 111 is maintained across a frequency band of interest (or operational frequency band) to ensure that the amplified main and peaking signals arrive in phase at the combining node structure 164, and thus to ensure proper Doherty amplifier operation. In the Doherty amplifier configuration depicted in FIG. 1 (i.e., a non-inverted Doherty configuration, as described below), an input phase delay circuit 109 is coupled between power splitter output 108 and peaking amplifier input 141. According to an embodiment, the input phase delay circuit 109 applies about 90 degrees of phase delay to the peaking input signal before it is provided to the peaking amplifier 140. For example, the input phase delay circuit 109 may include a quarter wave transmission line, a lumped-element delay circuit, or another suitable type of delay element or circuit with an electrical length of about 90 degrees.

Each of the main amplifier 120 and the peaking amplifier 140 includes a single power transistor or multiple cascaded power transistors for amplifying an RF signal conducted through the amplifier 120, 140. As used herein, the term "transistor" means a field effect transistor (FET) or another type of suitable transistor. For example, a "FET" may be a metal-oxide-semiconductor FET (MOSFET), a laterally-diffused MOSFET (LDMOS FET), an enhancement-mode or depletion-mode high electron mobility transistor (HEMT), or another type of FET. According to various embodiments, each of the power transistors in the main and peaking amplifier portions 120, 140 may be implemented, for example, using a silicon-based FET (e.g., an LDMOS FET), a silicon-germanium (SiGe) based FET, or a III-V FET (e.g., a HEMT), such as a gallium nitride (GaN) FET (or another type of III-V transistor, including a gallium arsenide (GaAs) FET, a gallium phosphide (GaP) FET, an indium phosphide (InP) FET, or an indium antimonide (InSb) FET).

According to an embodiment, the main amplifier 120 is a two-stage amplifier, which includes a relatively low-power pre-amplifier 126 and a relatively high-power final-stage amplifier 130 connected in a cascade arrangement between main amplifier input 121 and main amplifier output 134. In the main amplifier cascade arrangement, an output 127 of the pre-amplifier 126 is electrically coupled to an input 129 of the final-stage amplifier 130. Similarly, the peaking amplifier 140 is a two-stage amplifier, which includes a relatively low-power pre-amplifier 146 and a relatively high-power final-stage amplifier 150 connected in a cascade arrangement between a peaking amplifier input 141 and a peaking amplifier output 154. In the peaking amplifier cascade arrangement, an output 147 of the pre-amplifier 146 is electrically coupled to an input 149 of the final-stage amplifier 150. In other embodiments, each of the main amplifier 120 and the peaking amplifier 140 may be a single-stage amplifier, or may include more than two, cascade-coupled amplification stages. Input impedance matching networks 122, 142 (IMN) and inter-stage impedance matching networks 128, 148 (ISMN) may be implemented, respectively, at the input 125, 145 of each pre-amplifier 126, 146 and between each pre-amplifier 126, 146 and each final-stage amplifier 130, 150. In each case, the matching networks 122, 142, 128, 148 may incrementally increase the circuit impedance toward the load impedance.

During operation of Doherty amplifier 100, the main amplifier 120 is biased to operate in class AB mode, and the peaking amplifier 140 typically is biased to operate in class C mode. In some configurations, the peaking amplifier 140 may be biased to operate in class B or deep class B modes. At low power levels, where the power of the input signal at node 102 is lower than the turn-on threshold level of peaking amplifier 140, the amplifier 100 operates in a low-power mode in which the main amplifier 120 is the only amplifier supplying current to the load 196. When the power of the input signal exceeds a threshold level of the peaking amplifier 140, the amplifier 100 operates in a high-power mode in which the main amplifier 120 and the peaking amplifier 140 both supply current to the load 196. At this point, the peaking amplifier 140 provides active load modulation at combining node structure 164, allowing the current of the main amplifier 120 to continue to increase linearly.

As will be explained in more detail in conjunction with FIGS. 2-4, later, gate biasing of the main and peaking amplifiers 120, 140 may be performed using one or more resistor-divider gate bias circuits 170, 170' (e.g., resistor-divider gate bias circuits 270, 270', FIGS. 2, 3), in an embodiment, where each resistor-divider gate bias circuit 170, 170' includes at least one resistor 173, 174, 173', 174' electrically coupled between a gate bias voltage input 171, 171' and an input 125, 129, 145, 149 (e.g., a gate terminal) of each amplifier 126, 130, 146, 150. Drain biasing of the pre-amplifiers 126, 146 also may be performed with a drain bias circuit (not shown in FIG. 1, but shown in FIGS. 2, 3 as circuit 278).

A shunt-L circuit 180 is coupled between the output 154 of the peaking amplifier 140 and a ground reference (or ground reference node), in an embodiment. As mentioned previously, the shunt-L circuit 180 is configured to compensate for the drain-source capacitance at the output 151 of the peaking final-stage amplifier 150. In an embodiment, the shunt-L circuit 180 includes an inductance 182 and a capacitance 184 coupled in series between the output 154 of the peaking amplifier 140 and a ground reference.

In addition, embodiments of the inventive subject matter may include a video bandwidth (VBW) circuit 186 coupled between the output 154 of the peaking amplifier 140 and a ground reference. In a more specific embodiment, a VBW circuit 186 is coupled to a node (e.g., an "RF cold point" node, or some other node) between the inductance 182 and the capacitance 184 of the shunt-L circuit 180. As used herein, an "RF cold point" node is a conductive node that may function as a virtual ground reference voltage for RF electrical signals. The inductance 182 and capacitance 184 of the VBW circuit 186 may be integrated with die 101, or the inductance 182 and/or capacitance 184 may be implemented off chip, in various embodiments. Either way, the VBW circuit 186 is configured to improve the low frequency resonance (LFR) of amplifier 100 caused by the interaction between various circuitry and structures of the amplifier 100 by presenting a low impedance at envelope frequencies and/or a high impedance at RF frequencies. The VBW circuit 186 essentially may be considered to be "invisible" from an RF matching standpoint, as it primarily effects the impedance at envelope frequencies (i.e., VBW circuit 186 provides a termination for signal energy at the envelope frequencies of amplifier 100).

The VBW circuit 186 may have any of a number of configurations. In some embodiments, the VBW circuit 186 includes a series circuit of a resistor, an inductor, and a capacitor coupled between the peaking amplifier output 154 (or some other point along an amplification path 110, 111) and the ground reference. Although the VBW circuit 186 is shown to be coupled to a particular node in FIG. 1, the VBW circuit 186 could be coupled to another node, or multiple VBW circuits could be coupled to multiple points along each amplification path 110, 111. For example, a VBW circuit 186 could be coupled between each output 127, 147 of a pre-amplifier 126, 146 and a ground reference, or a VBW circuit 186 could be coupled between each output 131, 151 of a final-stage amplifier 130, 150 and the ground reference, or a VBW circuit 186 could be coupled between each input 125, 145 of a pre-amplifier 126, 146 and the ground reference.

Doherty amplifier 100 has a "non-inverted" load network configuration. In the non-inverted configuration, the input circuit is configured so that the input signals supplied to the peaking amplifier 140 are delayed by 90 degrees with respect to the input signal supplied to the main amplifier 120 at the center frequency of operation, fo, of the amplifier 100. To ensure that the main and peaking input RF signals arrive at the main and peaking amplifiers 120, 140 with about 90 degrees of phase difference, as is fundamental to proper Doherty amplifier operation, input phase delay circuit 109 applies about 90 degrees of phase delay to the peaking input signal before it is provided to the peaking amplifier 140, as described above.

To compensate for the 90 degree phase delay difference between the main and peaking amplification paths 110, 111 at the inputs of amplifiers 120, 140 (i.e., to ensure that the amplified signals arrive in phase at the combining node structure 164), the phase delay/impedance inverter circuit 160 is configured to apply about a 90 degree phase delay to the signal between the output of main amplifier 120 and the combining node structure 164. In addition, the phase delay/impedance inverter circuit 160 imparts an impedance inversion to the amplified RF signal along the main amplification path 110. The phase delay/impedance inverter circuit 160 includes multiple components 161, 162 connected in series, in an embodiment. For example, the components 161, 162 may include combinations of wirebonds and integrated transmission lines, as will be discussed in more detail in conjunction with FIGS. 2-4.

Alternate embodiments of Doherty amplifiers may have an "inverted" load network configuration. In such a configuration, the amplifier is configured so that an input signal supplied to the main amplifier 120 is delayed by about 90 degrees with respect to the input signal supplied to the peaking amplifier 140 at the center frequency of operation, f0, of the amplifier 100, and an output phase delay/impedance inverter circuit is configured to apply about a 90 degree phase delay and impedance inversion to the signal between the output of the peaking amplifier 140 and the combining node structure.

Doherty amplifier 100 is "integrated," as that term is used herein, because at least the main amplifier 120 (e.g., including the pre-amplifier 126 and the final-stage amplifier 130), the peaking amplifier 140 (including the pre-amplifier 146 and the final-stage amplifier 150), the phase delay/impedance inverter circuit 160, and the combining node structure 164 are integrated with or within one single IC die 101 (e.g., die 201, 301, FIGS. 2-4), which may be referred to herein as an "integrated Doherty amplifier die." According to an embodiment, all or portions of the input and inter-stage impedance matching networks 122, 142, 128, 148 also may be integrated with or within the same IC die 101 (e.g., die 201, 301, FIGS. 2-4). Further, the splitter 104 may be integrated with or within the same IC die 101 (e.g., die 201, FIG. 2). Alternatively, all or portion of the splitter 104 and/or input impedance matching networks 122, 142 may be implemented in one or more components that are distinct from the IC die that includes the main and peaking amplifiers 120, 140. According to another further embodiment, the resistor-divider bias circuits 170, 170' also are integrated with or within the same IC die 101 (e.g., die 201, 301, FIGS. 2, 3) as the main and peaking amplifiers 120, 140, although biasing may be performed by non-integrated circuits and structures in other embodiments. According to yet another further embodiment, the VBW circuit 186 also is integrated with or within the same IC die 101 (e.g., die 201, 301, FIGS. 2, 3) as the main and peaking amplifiers 120, 140, although the VBW circuit 186 may be implemented using non-integrated circuits and structures in other embodiments.

FIGS. 2 and 3 are top views of two example embodiments of Doherty power amplifier ICs 200, 300 (or "Doherty IC"). For enhanced understanding, FIG. 3 should be viewed simultaneously with FIG. 4, which is a side, cross-sectional view of the Doherty IC 300 of FIG. 3 along line 4-4. It should be noted that identical or substantially similar elements in FIGS. 2-4 are indicated using the same reference numbers. As used herein, the terms "integrated circuit die" and "IC die" mean a single, distinct semiconductor die (or semiconductor substrate) within which one or more circuit components (e.g., transistors, passive devices, and so on) are integrally-formed and/or directly physically connected to produce a monolithic structure.

Doherty ICs 200, 300 each include portions of an entire Doherty amplifier (e.g., Doherty amplifier 100, FIG. 1) integrated with or within a single semiconductor die 201, 301, where the semiconductor die has a substantially rectangular periphery defined by opposed input and output sides 210/211, 310/311 (e.g., bottom and top sides in the orientation of FIGS. 2 and 3) and opposed left and right sides 212/213, 312/313 that extend between the input and output sides. The circuitry within each die 201, 301 is electrically connected to external circuitry through leads (e.g., leads 214, 216, 217, 219, 287, 294, 314, 315) that are positioned adjacent to the input and output sides 210/211, 310/311 of the die 201, 301, and through wirebonds (e.g., wirebonds 219, 290) connected between the leads and bondpads (e.g., bondpads 202, 271, 271', 278, 285, 302, 302') on the die 201, 301.

In the specific embodiments illustrated in FIGS. 2 and 3, each Doherty amplifier IC 200, 300 includes the following circuitry integrated with or within semiconductor die 201, 301: a two-stage main amplifier 220 (e.g., main amplifier 120, FIG. 1), a two-stage peaking amplifier 240 (e.g., peaking amplifier 140, FIG. 1), a phase shifter/impedance inverter circuit 260 (e.g., phase shifter/impedance inverter 160, FIG. 1), a combining node structure 264 (e.g., combining node structure 164, FIG. 1), resistor-divider bias circuits 270, 270' (e.g., resistor-divider bias circuits 170, 170', FIG. 1), a drain bias circuit 278, and a shunt-L circuit 280 (e.g., shunt-L circuit 180, FIG. 1). The Doherty IC 200 of FIG. 2 further includes a power splitter 204 (e.g., power splitter 104, FIG. 1), and an input phase delay circuit 209 (e.g., input phase delay circuit 109, FIG. 1).

As seen most clearly in FIG. 4, each semiconductor die 201, 301 includes a base semiconductor substrate 410 and a plurality of build-up layers 412 over a top surface of the base semiconductor substrate 410. In a particular example embodiment, the base semiconductor substrate 410 is a high-resistivity silicon substrate (e.g., a silicon substrate having bulk resistivity in a range of about 1000 ohm/centimeter (cm) to about 100,000 ohm/cm or greater). Alternatively, the base semiconductor substrate 410 may be a semi-insulating gallium arsenide (GaAs) substrate (e.g., a GaAs substrate having bulk resistivity up to $10^8$ ohm/cm), or another suitable high-resistivity substrate. In still other alternate embodiments, the base semiconductor substrate 410 may be any of multiple variants of a GaN substrate or other III-V semiconductor substrates. An advantage to the use of a high-resistivity substrate is that such a substrate may enable various on-die circuitry (e.g., the on-die combining node structure 264 and other circuitry) to exhibit relatively low losses, when compared with amplifier ICs that do not utilize a high-resistivity substrate.

The plurality of build-up layers 412 may include, for example, a plurality of interleaved dielectric layers, patterned conductive layers, and other conductive structures (e.g., conductive polysilicon structures). Portions of different patterned conductive layers and structures are electrically coupled with conductive vias (e.g., via 432). Further, conductive through substrate vias (TSVs) (e.g., TSV 448) may provide conductive paths between the top and bottom surfaces of the base semiconductor substrate 410. The TSVs may or may not be lined with dielectric material to insulate the TSVs from the base semiconductor substrate 410. According to an embodiment, a conductive layer 428 on or at the bottom surface of the base semiconductor substrate 410 functions as a ground reference node for the Doherty IC 300. As used herein, a "ground reference node" means a conductive feature that is integrally-formed with the semiconductor die 201, 301, and which is configured to be electrically coupled to an external conductive feature which, in turn, may be electrically coupled to a ground reference voltage. Thus, although not shown in FIGS. 2-4, when the Doherty IC 200, 300 ultimately is packaged, the conductive layer 428 may be physically and electrically coupled to a ground node of a package substrate (e.g., flange 502, FIG. 5). In other embodiments, the "ground reference node" may be an integrally-formed conductive feature of die 201, 301 other than conductive layer 428 (e.g., the ground reference node may be a bondpad, end(s) of one or more conductive vias, or other integrally-formed conductive features).

In the below description of the Doherty ICs 200, 300, reference will be made to various circuits that include capacitors, inductors, and/or resistors. The capacitors may be, for example, integrated metal-insulator-metal (MIM) capacitors (e.g., capacitor 284, FIGS. 2-4) formed within the build-up layers (e.g., layers 412), discrete capacitors coupled to the top surface of the die 201, 301, and/or other types of capacitors, in various embodiments. The resistors may be, for example, integrated resistors (e.g., formed from polysilicon within the build-up layers 412), or discrete resistors coupled to the top surface of the die 201, 301. The inductors may be integrally-formed spiral inductors (e.g., spiral inductors 282', 282", FIGS. 2-4) formed from patterned conductive layers and vias within the build-up layers (e.g., layers 412), or they may be discrete inductors or inductances formed from wirebonds (e.g., wirebonds 261, 282, 290, FIGS. 2-4), patterned conductive traces (e.g., bondpad 262 and trace 263, FIGS. 2, 3), or other inductive components.

In the embodiment of FIGS. 2-4, each of the main amplifier 220 and the peaking amplifier 240 include a cascade arrangement of two power transistors, including a relatively low-power pre-amplifier transistor 226, 246 (e.g., pre-amplifiers 126, 146, FIG. 1) and a relatively high-power final-stage amplifier transistor 230, 250 (e.g., final-stage amplifiers 130, 150, FIG. 1). The description herein refers to each transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize bipolar junction transistors (BJT) devices or other suitable types of transistors.

Each transistor 226, 230, 246, 250 includes a gate terminal 225, 229, 245, 249 (or control terminal), a drain terminal 227, 231, 247, 251 (or first current-carrying terminal), and a source terminal (or second current-carrying terminal), not numbered. In a specific embodiment, each transistor 226, 230, 246, 250 is an LDMOS FET, which includes an active area disposed between gate and drain terminals. Each active area includes a plurality of elongated, parallel-aligned, and interdigitated drain regions and source regions, where each drain region and each source region is a doped semiconductor region formed in the base semiconductor substrate (e.g., substrate 410). Due to their elongated shapes, each set of adjacent drain and source regions, along with an associated gate structure, may be referred to as a "transistor finger," and each transistor 226, 230, 246, 250 includes a plurality of parallel transistor fingers within the active area of the transistor (indicated with vertical lines in FIGS. 2 and 3).

A variably-conductive channel (and, in some embodiments, a drain drift region) is present between adjacent source and drain regions. Conductive (e.g., polysilicon or metal) gate structures formed over the base semiconductor substrate (e.g., substrate 410) are coupled to and extend from each gate terminal 225, 229, 245, 249 over and along the channel regions. Similarly, additional conductive (e.g., polysilicon) drain structures formed over the base semiconductor substrate (e.g., substrate 410) are coupled to and extend from each drain terminal 227, 231, 247, 251 over and along the drain regions. The source regions are electrically coupled to conductive (e.g., polysilicon or metal) source contacts, which in turn are coupled to conductive TSVs (e.g., TSV 448, FIG. 4) that extend through the base semiconductor substrate (e.g., substrate 410) to connect with a conductive layer (e.g., layer 428) on the bottom surface of the base semiconductor substrate. Voltages applied to the gate terminals 225, 229, 245, 249 during operation modulate the conductivity of the variably-conductive channels, thus enabling current flow between source and drain regions (or ultimately between conductive layer 428 and each drain terminal 227, 231, 247, 251).

The circuitry integrated within and coupled to Doherty IC 200, 300 will now be described in more detail. Referring first to FIG. 2, Doherty IC 200 includes an integrated power splitter 204 (e.g., power splitter 104, FIG. 1). More specifically, an input terminal 202 (e.g., input node 102, FIG. 1), which is configured to receive an input RF signal for amplification, is electrically connected to a splitter input 205 (e.g., input 105, FIG. 1) of power splitter 204 through a conductive path implemented in the build-up layers of the Doherty IC 200. Input terminal 202 may include, for example, a conductive bondpad, which is exposed at the top surface of the die 201, and which is configured for attachment of one or more wirebonds 219. Alternatively, die 201 may be a flip-chip die or the input terminal may be exposed at the bottom surface of the die 201, in which case the input terminal 202 may consist of a conductive land or other type of connection. These alternate configurations also may apply to the other terminals (e.g., terminals 271, 271', 278) of the Doherty IC 200.

The power splitter 204 (e.g., power splitter 104, FIG. 1) is configured to divide the power of an input RF signal received at input terminal 202 into main and peaking portions of the input signal. As described in conjunction with FIG. 1, power splitter 204 is configured to divide the power of the input RF signal received at input terminal 202 into one main portion of the input signal (or "main input signal") and one peaking portion of the input signal (or "peaking input signal". The main input signal is produced at power splitter output 206 (e.g., output 106, FIG. 1), and the peaking input signal is produced at power splitter output 208 (e.g., output 108, FIG. 1). As also discussed previously, the power splitter 204 may divide the power equally or unequally, depending on the relative sizes of the main amplifier 220 and the peaking amplifier 240. In the embodiments of FIGS. 2 and 3, the main amplifier 220 is about half the size of the peaking amplifier 240 (i.e., the final-stage amplifier FETs 230, 250 have a 1:2 size relationship, and the Doherty amplifier is an asymmetric amplifier with a 1:2 main-to-peaking ratio), and thus the power splitter 204 divides the input RF signal so that about one third of the input signal power is produced at power splitter output 206, and about two thirds of the input signal power is produced at power splitter output 208. In other embodiments, the main and peaking amplifiers 220, 240 may have a different asymmetrical size relationship. In still other embodiments, the sizes of the main amplifier 220 and the peaking amplifier 240 may be equal (i.e., the final-stage amplifier FETs 230, 250 have a 1:1 size relationship, and the Doherty amplifier is a symmetric amplifier with a 1:1 main-to-peaking ratio), in which case the power splitter 204 may divide the power of the RF input signal into equal portions.

Input terminal 205 has a 50-ohm input impedance, in an embodiment, although the input impedance may be less or greater than 50 ohms, as well. According to an embodiment, the power splitter 204 has a Wilkinson-based design, which essentially divides the power of the input signal received at input 205 into two signals (i.e., a main input signal and a peaking input signal) with equal phase at outputs 206 and 208. In an alternate embodiment, power splitter 204 may divide the power of the input signal received at input 205 into two signals that are out of phase with each other (e.g., 90 degrees out of phase).

Output 206 of power splitter 204 is electrically connected to the input of the main amplifier 220 through a conductive path implemented in the build-up layers of the die 201. According to an embodiment, output 208 of power splitter 204 is electrically connected to the input of the peaking amplifier 240 through input phase delay circuit 209 (e.g., input phase delay circuit 109, FIG. 1) and additional conductive paths implemented in the build-up layers of the die 201. The input phase delay circuit 209 is configured to impart a delay to the peaking input signal to ensure that the peaking input signal at the input to the peaking amplifier 240 has about 90 degrees of phase difference from the main input signal at the input to the main amplifier 220. According to an embodiment, the input phase delay circuit 209 is implemented with integrated components, which as indicated by the circuit schematic next to circuit 209, may include a pi-configured phase delay circuit. For example, the phase delay circuit 209 may include an integrated inductor with a first terminal coupled to an output 408 of splitter 204, and a second terminal coupled to an input to the peaking amplifier 240, along with integrated shunt capacitors coupled between each inductor terminal and the ground reference. In an alternate embodiment, the input phase delay circuit 209 could be implemented using transmission lines (or wirebonds) having a suitable electrical length (e.g., about 90 degrees or a lesser amount that is sufficient to produce the desired phase delay) or using some other delay circuit structure or configuration.

Referring now to FIG. 3, Doherty IC 300 differs from Doherty IC 200 in that Doherty IC 300 does not include an integrated power splitter (e.g., power splitter 204, FIG. 2). Instead, an input RF signal is divided by a power splitter (e.g., power splitter 630, FIG. 6) of the external electrical system to which the Doherty IC 300 is coupled. A phase difference (e.g., of about 90 degrees) between the main and peaking input signals also is imparted by the external electrical system. The main input signal is provided to the main amplifier 220 through a main input lead 314, wirebonds 319, and bondpad 302, and the peaking input signal is provided to the peaking amplifier 240 through a peaking input lead 315, wirebonds 319', and bondpad 302'.

Referring again to both embodiments of Doherty IC 200, 300, each of the main amplifier 220 and the peaking amplifier 240 may have a substantially similar configuration, in an embodiment. According to an embodiment, each amplifier 220, 240 is a two-stage amplifier, which includes a relatively low-power pre-amplifier 226, 246 (or pre-amplifier FET) and a relatively high-power final-stage amplifier transistor 230, 250 (or final-stage amplifier FET) connected in a cascade arrangement between an amplifier input 221, 241 and a combining node structure 264.

In the main amplifier 220, an input 221 of the amplifier 220 is coupled through an input impedance matching network 222 (e.g., IMN 122, FIG. 1) to an input terminal 225 (e.g., gate terminal) of pre-amplifier FET 226, and an output 227 (e.g., drain terminal) of the pre-amplifier FET 226 is electrically coupled through an inter-stage impedance matching network 228 (e.g., ISMN 128, FIG. 1) to an input terminal 229 (e.g., gate terminal) of final-stage amplifier FET 230. Similarly, in the peaking amplifier 240, an input 241 of the amplifier 240 is coupled through an input impedance matching network 242 (e.g., IMN 142, FIG. 1) to an input terminal 245 (e.g., gate terminal) of pre-amplifier FET 246, and an output 247 (e.g., drain terminal) of the pre-amplifier FET 246 is electrically coupled through an inter-stage impedance matching network 248 (e.g., ISMN 148, FIG. 1) to an input terminal 249 (e.g., gate terminal) of final-stage amplifier FET 250. The source terminals of each of FETs 226, 230, 246, 250 are electrically coupled to a ground reference (e.g., using TSVs through the base semiconductor substrate 410 to a bottom conductive layer 428, FIG. 4).

Each pre-amplifier FET 226, 246 may be equal in size, in an embodiment, and may be configured to apply a gain to a respective input RF signal in a range of about 15 decibels (dB) to about 25 dB when the Doherty IC 200, 300 is operating in a high-power mode (e.g., close to compression), although only pre-amplifier FET 226 provides gain to its input signal when the Doherty IC 200, 300 is operating in a low-power mode. The final-stage amplifier FETs 230, 250 are significantly larger than the pre-amplifier FETs 226, 246 (e.g., at least twice as large to apply at least twice the gain). In an asymmetric configuration, as shown in FIGS. 2 and 3, the final-stage amplifier FETs 230, 250 differ in size. Specifically, the final-stage amplifier FET 250 of the peaking amplifier 240 is about twice the size of the final-stage amplifier FET 230 of the main amplifier 220, although the size ratio may be different, as well. Either way, each final-stage amplifier FET 230, 250 may be configured to apply a gain to a respective input RF signal in a range of about 15 dB to about 25 dB when the Doherty IC 200, 300 is operating in a high-power mode (e.g., close to compression), although only final-stage amplifier FET 230 provides gain to its input signal when the Doherty IC 200, 300 is operating in a low-power mode.

According to an embodiment, gate bias voltages for each of the FETs 226, 230, 246, 250 are provided through resistor-divider gate bias circuits 270, 270' (e.g., resistor-divider gate bias circuits 170, 170', FIG. 1). As indicated previously, for proper operation of Doherty amplifier IC 200, 300, the main amplifier 220 is biased to operate in class AB mode, and the peaking amplifier 240 typically is biased to operate in class C mode. Because the main amplifier 220 is biased differently from the peaking amplifier 240, the main amplifier resistor-divider gate bias circuit 270 is distinct from (and not electrically connected to) the peaking amplifier resistor-divider gate bias circuit 270'.

In the illustrated embodiments, the main amplifier resistor-divider gate bias circuit 270 includes a bias input terminal 271, resistors 273, 274, and RF isolation circuits 275, 276. Similarly, the peaking amplifier resistor-divider gate bias circuit 270' includes a bias input terminal 271', resistors 273', 274', and RF isolation circuits 275', 276'.

Terminals 271 and 271' each may include a conductive bondpad that is exposed at the top surface of the die 201, 301, and which is configured for attachment of one or more wirebonds. The input terminals 271, 271' enable a main amplifier gate bias voltage to be supplied through a first bias lead 216 (e.g., lead 516, FIG. 5), and a peaking amplifier gate bias voltage to be supplied through a second bias lead 217 (e.g., lead 517, FIG. 5).

Resistors 273, 274 or 273', 274' are electrically connected in series between input terminal 271, 271' and a ground reference. The first resistor 273, 273' has a first terminal electrically coupled to the input terminal 271, 271' and to the gate terminal 225, 245 of a pre-amplifier FET 226, 246. A node between input terminal 271, 271' and resistor 273, 273' is electrically connected to the gate terminal 225, 245 of the pre-amplifier FET 226, 246, and an intermediate node (between resistors 273/273', 274/274') is electrically connected to a gate terminal 229, 249 of a final-state amplifier FET 230, 250. The resistance values of resistors 273, 273', 274, 274' are selected to divide the main or peaking pre-amplifier gate bias DC voltage supplied at input terminal 271, 271' (or at gate terminal 225, 245) into fractions, so that desired DC bias voltages are provided at gate terminals 229, 249. For example, resistors 273/273', 274/274' may have equal or unequal resistance values in a range of about 500 ohms to about 10,000 ohms, although resistors 273/273', 274/274' may have lower or higher resistance values, as well.

To ensure that a significant amount of RF power is not lost through the bias circuits 270, 270', the main and peaking amplifiers 220, 240 are de-coupled (or isolated) from the bias circuits 270, 270' with RF isolation circuits 275/275', 276/276'. More specifically, RF isolation circuits 275, 275' are electrically coupled between a bias input terminal 271, 271' and a gate terminal 225, 245, and RF isolation circuits 276, 276' are electrically coupled between resistor 273, 273' and gate terminal 229, 249. According to an embodiment, each RF isolation circuit 275, 275', 276, 276' includes an integrated, lumped-element equivalent of a quarter wave (lambda/4) transmission line, with a reactive component that resonates at the center frequency of operation, f0, of the amplifier 200, 300. Ideally, using this configuration, the bias circuits 270, 270' emulate infinite impedance at frequencies near the center frequency of operation, thus isolating the bias circuits 270, 270' at those frequencies.

In addition to the gate bias circuits 270, 270', each Doherty amplifier IC 200, 300 also may include one or more drain bias circuits 277. According to an embodiment, a drain bias circuit 277 includes a bias input terminal 278 and RF isolation circuits 279, 279'. Again, bias input terminal 278 may include a conductive bondpad that is exposed at the top surface of the die 201, 301, and which is configured for attachment of one or more wirebonds. The input terminal 278 enables a drain bias voltage to be supplied through a third bias lead 218 (e.g., lead 518, FIG. 5).

The input terminal 278 is electrically connected to the drain terminals 227, 247 of each of the pre-amplifier FETs 226, 246, in an embodiment, to supply the same DC drain bias voltages to each FET 226, 246. Again, to ensure that a significant amount of RF power is not lost through the bias circuit 277, main amplifier 220 and peaking amplifier 240 are de-coupled (or isolated) from the bias circuit 277 with RF isolation circuits 279, 279'. More specifically, each RF isolation circuit 279, 279' is electrically coupled between the input terminal 278 and a drain terminal 227, 247 of a pre-amplifier FET 226, 246. Again, each RF isolation circuit 279, 279' may include an integrated, lumped-element equivalent of a quarter wave (lambda/4) transmission line, with a reactive component that resonates at the center frequency of operation, f0. It should be noted that drain bias voltages may be supplied to final-stage amplifier FETs 230, 250 through one or more device output leads (e.g., output lead 294) and a connection (e.g., wirebonds 290) between the device output lead and combining structure 264, in an embodiment.

Returning to the amplification paths of the main and peaking amplifiers 220, 240, the outputs (i.e., drain terminals 231, 251) of each of the final-stage amplifier FETs 230, 250 are electrically connected to combining node structure 264 (e.g., combining node structure 164, FIG. 1), which functions to combine the amplified RF signals produced by each of the final-stage amplifier FETs 230, 250 into a single amplified output RF signal. According to an embodiment, the combining node structure 264 essentially corresponds to the drain terminal 251 of the final-stage peaking amplifier FET 250. In practice, the combining node structure 264 may be implemented with a conductive structure that is closely electrically coupled to the drain terminal 251 of the final-stage peaking amplifier FET 250. Desirably, the drain terminal 251 is connected to the combining node structure 264 with a conductive path having a negligible phase delay (i.e., as close to zero degrees of phase delay as possible, such as 10 degrees or less of phase delay), and in some embodiments, the drain terminal 251 may be an integrally-formed portion of the combining node structure 264. In other words, the drain terminal manifold of the final-stage peaking amplifier FET 250 may form a portion of the combining node structure 264, in some embodiments. The combining node structure 264 also is closely electrically coupled to a bondpad 281 exposed at the top surface of die 201, 301, and in some embodiments, the combining node structure 264 and the bondpad 281 are the same conductive structure.

In contrast, the drain terminal 231 of the final-stage main amplifier FET 230 is coupled to the combining node structure 264 (or to drain terminal 251) through a phase delay/impedance inverter circuit 260 (e.g., circuit 160, FIG. 1). The phase delay/impedance inverter circuit 260 is configured to compensate for the 90 degree phase delay difference between the main and peaking amplification paths at the inputs of amplifiers 220, 240 (i.e., to ensure that the amplified signals arrive in phase at the combining node structure 264). Accordingly, the phase delay/impedance inverter circuit 260 is configured to apply about a 90-degree phase delay to the signal between the drain terminal 231 of the final-stage main amplifier FET 230 and the combining node structure 264. In addition, the phase delay/impedance inverter circuit 260 imparts an impedance inversion to the amplified RF signal produced by the final-stage main amplifier FET 230.

The phase delay/impedance inverter circuit 260 includes multiple components 261, 262, 263 (e.g., components 161, 162, FIG. 1) connected in series, in an embodiment. In the specific example embodiments of FIGS. 2 and 3, the components 261-263 include a set of one or more wirebonds 261 (a first inductance), a bondpad 262 (a second inductance), and an integrated transmission line 263 (a third inductance) connected in series between the drain terminal 231 of the final-stage main amplifier FET 230 and the combining node structure 264. In other embodiments, the multiple components 261-263 may be series-coupled in a different order, or more, fewer, or different components may be used to implement the phase delay/impedance inverter circuit 260. For example, some alternate embodiments of a phase delay/impedance inverter circuit 260 may include only wirebonds or only transmission lines. Still other alternate embodiments may include integrated or discrete inductors and/or other components.

According to an embodiment, the phase delay/impedance inverter circuit 260 has a CLC (capacitance-inductance-capacitance) topology between drain terminal 231 and drain terminal 251. The first (shunt) capacitance includes the drain-source capacitance, $C_{dsM}$, of the main amplifier final-stage FET 230. In some embodiments, this first (shunt) capacitance may be augmented with additional capacitance provided by one or more additional shunt capacitors (e.g., MIM capacitors, not illustrated) that are electrically coupled in parallel with $C_{dsM}$, between the main amplifier final-stage FET drain terminal 231 and the die ground reference (e.g., conductive layer 428, FIG. 4). Desirably, for a symmetrical Doherty amplifier, the capacitance of the additional shunt capacitors is selected so that the combined capacitance of $C_{dsM}$ and the additional shunt capacitors is approximately equal to the drain-source capacitance, $C_{dsP}$, of the final-stage peaking amplifier FET 250. For an asymmetrical Doherty amplifier, such as that illustrated in FIGS. 2 and 3, the drain-source capacitance, $C_{dsM}$, of the final-stage main amplifier FET 230 may be designed to be lower than the drain-source capacitance, $C_{dsP}$, of the final-stage peaking amplifier FET 250. In an asymmetrical Doherty amplifier embodiment, the combined capacitance of $C_{dsM}$ and the additional shunt capacitors, if included, should be designed as follows: 1) so that the transmission path (or "pseudo-transmission line") between the final-stage main amplifier FET 230 and the final-stage peaking amplifier FET 250 provides about a 90 degree phase shift at the center frequency of operation, and 2) so that:

$$L_D = \frac{1}{(2*\pi*freq)^2 * C_{DS}}$$

$$Z_C = \sqrt{\frac{L_D}{C_{DS}}},$$

where freq is the center frequency of operation (f0), LD is the inductance of the conductive path between the drain terminal 231 of the main amplifier final-stage FET 230 and the drain terminal 251 of the final-stage peaking amplifier FET 250, $C_{DS}$ is the output capacitance of the final-stage main amplifier FET 230 and/or the final-stage peaking amplifier FET 250, and $Z_C$ is the characteristic impedance of the pseudo-transmission line between the drain terminal 231 of the final-stage main amplifier FET 230 and the drain terminal 251 of the final-stage peaking amplifier FET 250. For example, the parallel combination of $C_{dsM}$ and the additional shunt capacitors may have a combined capacitance value in a range of about 3 picofarads (pF) to about 10 pF (e.g., about 5 pF to about 6 pF) at a center frequency of operation of about 2.0 gigahertz (GHz), in an embodiment, although the center frequency of operation and/or the combined capacitance could be lower or higher, as well.

The inductance in the CLC topology of the phase delay/impedance inverter circuit 260 is provided by the series combination of wirebonds 261, bondpad 262, and transmission line 263. The wirebond(s) 261 each have a first end that is connected to a first bondpad 265 (that in turn is closely electrically coupled to the final-stage main amplifier FET drain terminal 231), and a second end that is connected to a bondpad 262 (referred to below as an "inter-inductor node"), where both bondpads 262, 265 are integrally-formed with and exposed at the top surface of die 201, 301. The bondpad 262 is electrically coupled to a first end of transmission line 263, and a second end of transmission line 263 is electrically coupled to the combining node structure 264 (and/or to drain terminal 251). Transmission line 263 may be implemented, for example, with one or more patterned portion(s) of one or more conductive layers of the build-up layers of the die 201, 301 (e.g., build-up layers 412, FIG. 4), and thus transmission line 263 is integrally-formed with die 201, 301. According to an embodiment, the series combination of the wirebonds 261, bondpad 262, and transmission line 263 have a combined inductance in a range of about 0.8 nanohenries (nH) to about 1.2 nH at a center frequency of operation of about 2.0 GHz, although the center frequency and/or the combined inductance could be lower or higher, as well.

Finally, the second (shunt) capacitance in the CLC topology of the phase delay/impedance inverter circuit 260 approximately equals the drain-source capacitance, $C_{dsP}$, of the final-stage peaking amplifier FET 250 minus a portion of $C_{dsP}$ that is compensated for by a shunt inductance (e.g., of shunt inductor 282, 282', 282"), as will be explained below. In other words, the second shunt capacitance may be represented by $A \times C_{dsP}$, where $A<1.0$, and $(1.0-A) \times C_{dsP}$ is equivalent to a negative capacitance provided by a compensating shunt inductance (e.g., of shunt inductor 282, 282', 282"). The $C_{dsP}$ capacitance has a capacitance value in a range of about 5 pF to about 10 pF (e.g., about 7 pF to about 8 pF) at a center frequency of operation of about 2.0 GHz, in an embodiment, although the center frequency and/or the capacitance could be lower or higher, as well.

To summarize, the 90 degree phase difference between drain terminal 231 and drain terminal 251 (or combining node 264) is provided by a phase delay/impedance inverter circuit 260 with a CLC topology, where that topology includes a first shunt capacitance (e.g., provided by $C_{dsM}$ and possibly additional shunt capacitors), a series inductance circuit (e.g., provided by wirebonds 261, bondpad 262, and transmission line 263), and a second shunt capacitance (e.g., provided by $A \times C_{dsP}$, where $A<1.0$).

The RF signals amplified though the main and peaking amplification paths are combined substantially in-phase at the combining node 264, as described previously, to produce an amplified output RF signal. The combining node 264 is electrically connected to an output lead 294 (e.g., output node 194, FIG. 1) through a plurality of wirebonds 290 (e.g., inductance 190, FIG. 1), in an embodiment. Accordingly, the amplified output RF signal is conveyed from the combining node 264 to the output lead 294 through wirebonds 290. According to an embodiment, wirebonds 290 are configured to have a relatively low inductance, such as an inductance value in a range of about 20 picohenries (pH) to about 70 pH (e.g., about 60 pH) although the inductance value may be smaller or larger, as well. Desirably, wirebonds 670 are designed so that the inductance value of wirebonds 670 is as low as possible.

According to an embodiment, a shunt-L circuit 280 (e.g., shunt-L circuit 180, FIG. 1) is coupled between the final-stage peaking amplifier drain terminal 251 (or combining node 264) and the die ground reference (e.g., conductive layer 428, FIG. 4), in an embodiment. As mentioned previously, the shunt-L circuit 280 is configured to compensate for (e.g., resonate out) the drain-source capacitance at the drain terminal 251 of the final-stage peaking amplifier FET 250. In an embodiment, the shunt-L circuit 280 includes a shunt inductance (e.g., inductance 182, FIG. 1) and a shunt capacitance (e.g., capacitance 184, FIG. 1) coupled in series between the drain terminal 251 of the final-stage peaking amplifier FET 250 and the ground reference. The shunt capacitance is configured to provide a low-impedance path to ground for very low-frequency signal energy (e.g., DC), and a high impedance path to ground for signal energy in the band of operation of the amplifier 200, 300. In alternate embodiments, the shunt-L circuit may be coupled instead between the final-stage main amplifier drain terminal 231 and the die ground reference, or shunt-L circuits may be coupled between both drain terminals 231, 251 and the die ground reference.

The shunt inductance of the shunt-L circuit 280 is implemented with a set of one or more wirebonds 282 coupled in series with one or more integrally-formed inductors 282', 282", in an embodiment. The wirebond(s) 282, which represent a first integrated inductance, each have a first end that is connected to a first bondpad 281 (that in turn is closely electrically coupled to combining node 264 and to the final-stage peaking amplifier drain terminal 251), and a second end that is connected to a bondpad 283 (referred to below as an "inter-inductor node"), where both bondpads 281, 283 are integrally-formed with and exposed at the top surface of die 201, 301. Essentially, the set of wirebonds 282 may be considered an inductance, where the first end(s) of the wirebonds 282 correspond to a first terminal of the inductance, and the second end(s) of the wirebonds 282 correspond to a second terminal of the inductance. In alternate embodiments, more or fewer than two wirebonds may be used to implement the first inductance. In still other alternate embodiments, the set of wirebonds 282 may be replaced with one or more discrete inductors with first and second terminals connected to distinct bonding pads exposed at the top surface of the die 201, 301.

The integrated inductors 282', 282", which together represent a second inductance, are coupled in parallel between the inter-inductor node 283 and a second conductive node 285, which in one embodiment may be an RF cold point node. More specifically, each of the integrated inductors 282', 282" includes an integrally-formed spiral inductor formed from portions of one or more layers of the build-up structure of the die 201, 301 (e.g., build-up layers 412, FIG. 4), where a first terminal (or end) of each spiral inductor is coupled to the inter-inductor node 283, and a second terminal (or end) of each spiral inductor is coupled to node 285. In alternate embodiments, the two, parallel-coupled integrated inductors 282', 282" may be replaced with a single integrated inductor, with more than two parallel-coupled integrated inductors, or with one or more discrete inductors coupled to the top surface of the die 201, 301.

As used herein, a "band of operation" or "operational band" of amplifier 200, 300 means a range of frequencies that is bounded by lower and upper −3 dB cutoff frequencies. According to an embodiment, the shunt inductance of the shunt-L circuit has an inductance value that is selected so that the shunt inductance and the drain-source capacitance, CdsP, of the final-stage peaking amplifier FET 250 resonate at a frequency that is below a band of operation of the amplifier 200, 300. For example, the shunt inductance and CdsP may resonate at a frequency that is at least 300 megahertz (MHz) below a band of operation of the amplifier 200, 300 (e.g., the resonant frequency of the shunt inductance and CdsP may be 300-500 MHz below the band of operation, although the resonant frequency may be higher or lower, as well). As a specific non-limiting example, when amplifier 200, 300 has a center frequency of operation, f0, of 2.0 GHz and a 400 MHz wide band of operation between a lower cutoff frequency of 1.8 GHz and an upper cutoff frequency of 2.2 GHz, the resonant frequency of the shunt inductance and CdsP may be 300-500 MHz or more below the lower cutoff frequency (e.g., the resonant frequency may be between 1.3 GHz and 1.5 GHz, although the resonant frequency may be lower or higher, as well). In other embodiments, the center frequency of operation may be less or greater than 2.0 GHz, and the band of operation may be narrower or wider, and accordingly, the shunt inductance value may be selected to resonate with CdsP at a different frequency below the corresponding band of operation.

The shunt inductance of the shunt-L circuit essentially improves the quality of the combining node structure 264 (e.g., improves Zopt and Zmod at the center frequency of operation) by reducing the difference between the effective drain-source capacitances of the final-stage main and peaking amplifier transistors 230, 250. More specifically, because amplifier 200, 300 is an asymmetrical Doherty amplifier, the drain-source capacitance (CdsP) of the final-stage peaking amplifier transistor 250 is larger than the drain-source capacitance (CdsM) of the final-stage main amplifier transistor 230. When the main-to-peaking size ratio is about 1:2, for example, the drain-source capacitance of the final-stage peaking amplifier transistor 250 may be about 50-80 percent greater than the drain-source capacitance (CdsM) of the final-stage main amplifier transistor 230 (e.g., for a 1:2 asymmetry ratio, CdsM may be about 3.7 pF and CdsP may be about 4.9 pF). The shunt inductance of the shunt-L circuit is configured to reduce a difference between the drain-source capacitance of the final-stage main amplifier FET 250, CdsM, and an effective drain-source capacitance of the final-stage peaking amplifier FET 230, and in some embodiments, the shunt inductance is configured to make the effective drain-source capacitance of the final-stage peaking amplifier FET 250 approximately equal to the drain-source capacitance of the final-stage main amplifier FET 230 (or the effective capacitance of the final-stage main amplifier FET if another shunt inductance is closely electrically coupled to the drain of the final-stage main amplifier FET).

Utilizing the shunt-L circuit 280 to resonate out at least some of the drain-source capacitance of the final-stage peaking amplifier transistor 250 essentially equalizes (or significantly reduces the difference between) the effective drain-source capacitance(s) of the main and peaking final-stage amplifier transistors 230, 250, which improves the quality of the combining node structure 264. In other words, a total shunt inductance provided by the series-coupled arrangement of wirebond(s) 282 and inductors 282', 282" is selected to resonate out at least some of the drain-source capacitance of the final-stage peaking amplifier transistor 250. For example, in the above-given example of an amplifier 200, 300 with a 1:2 asymmetry ratio, CdsM of about 3.7 pF, and CdsP of about 4.9 pF, a shunt-L circuit 280 with a total shunt inductance of about 5 nH may reduce the effective drain-source capacitance of the final-stage peaking amplifier transistor 250 (i.e., the drain-source capacitance as altered by the shunt inductance) from 4.9 pF to approximately to 3.7 pF (i.e., a value equal to the drain-source capacitance of the final-stage main amplifier transistor 230).

Factors affecting the selection of the total shunt inductance include, for example, the asymmetry ratio between the main and peaking amplifier transistors 230, 250 (and thus the difference in drain-source capacitance between the transistors 230, 250), the power level of the amplifier, and the center frequency of operation of the amplifier 200, 300. Generally, as the asymmetry ratio, the center frequency of operation, and/or the power level increases, the selected total shunt inductance decreases, and conversely as the asymmetry ratio, the center frequency of operation, and/or the power level decreases, the selected total shunt inductance increases. For example, for a 30 watt amplifier 200, 300 with a 1:2 asymmetry ratio and a center frequency, f0, of about 2 GHz, a total shunt inductance provided by the series-coupled arrangement of wirebond(s) 282 and inductors 282', 282" may be in a range of about 1 nH to about 10 nH (e.g., about 5 nH) although the total shunt inductance may be lower or higher, as well. All other things being equal, if the center frequency of operation were increased to 4 GHz, the selected total shunt inductance could be decreased to about half the value for a 2 GHz amplifier. Alternatively, if the power level were decreased to 15 watts with all other things being equal, the selected total shunt inductance could be roughly doubled for a 2 GHz amplifier.

According to an embodiment, a portion of the total shunt inductance of the shunt-L circuit 280 is provided by wirebond(s) 282, and another portion of the total shunt inductance is provided by integrated inductors 282', 282". In some embodiments, the portion of the total shunt inductance that is provided by wirebond(s) 282 could be between about 20 percent and about 80 percent of the total shunt inductance of the shunt-L circuit 280. For example, a first inductance provided by wirebond(s) 282 may have an inductance value in a range of about 0.5 nH to about 9.5 nH, and a second inductance provided by parallel-coupled integrated inductors 282', 282" may be in a range of about 0.5 nH to about 9.5 nH for an amplifier 200, 300 with a center frequency of operation of about 2 GHz. Although specific example ranges and values are provided above, in other embodiments, the inductance value of any of elements 282, 282', 282", and/or the total inductance value of all elements 282, 282', 282" may be smaller or larger than the above given ranges.

The shunt capacitance of the shunt-L circuit 280 is implemented with an integrally-formed capacitor 284, in an embodiment. Capacitor 284 has a first terminal (or plate) electrically coupled to node 285, and a second terminal (or plate) electrically coupled to the die ground reference (e.g., conductive layer 428, FIG. 4), in an embodiment. According to an embodiment, capacitor 284 may include one or MIM capacitors formed within the build-up layers of the die 201, 301 (e.g., layers 412, FIG. 4), for example. Alternatively, capacitor 284 may be integrally-formed within the base semiconductor substrate (e.g., substrate 410, FIG. 4) with vertical and/or horizontal conductive layers (e.g., polysilicon) separated by dielectric material. In still other embodiments, capacitor 284 may be a discrete capacitor coupled to the surface of the die 201, 301. In still other alternate embodiments, node 285 may be coupled to a bondpad, capacitor 284 may be connected to a substrate other than the die 201, 301, and wirebonds may be used to electrically couple the bondpad (or node 285) to the off-die capacitor 284. Either way, according to an embodiment, a capacitance value of capacitor 284 is in a range of about 500 pF to about 2000 pF, although the capacitance value of capacitor 284 may be lower or higher, as well.

Although the embodiment of the shunt-L circuit 280 shown in FIGS. 2-4 includes a series-coupled circuit that includes particular components (i.e., wirebonds 282, integrated inductors 282', 282", and integrated capacitor 284) in a particular series order, other embodiments may include different implementations of the shunt-L circuit 280, including different series arrangements of the components, different physical types of components, additional components, or fewer components. By way of non-limiting example, a different series arrangement may include one or more integrated inductors (e.g., inductors 282' and/or 282") with first terminals directly electrically connected to the drain terminal 251, and with second terminals coupled to an inter-inductor bondpad (e.g., bondpad 283), and further may include wirebond(s) (e.g., wirebonds 282) with first ends coupled to the inter-inductor bondpad, and with second ends coupled to node 285. Still other embodiments of a shunt-L circuit 280 may include only wirebonds or only integrated inductors. In addition, the physical components of the inductance of the shunt-L circuit 280 may include any combination of inductive components selected from one or more integrally-formed inductors, one or more sets of wirebonds, and/or one or more discrete inductors, and the inductive components of the shunt-L circuit 280 may be interconnected using any series and/or parallel arrangement to achieve the desired total inductance value for the shunt inductance of the shunt-L circuit 280. Similarly, the physical components of the capacitance of the shunt-L circuit may include any combination of capacitive components selected from one or more integrally-formed capacitors and/or one or more discrete capacitors, and the capacitive components of the shunt-L circuit 280 may be interconnected using any series and/or parallel arrangement to achieve the desired total capacitance value for the shunt capacitance of the shunt-L circuit 280.

As indicated previously, embodiments of Doherty amplifier IC 200, 300 also may include one or more video bandwidth (VBW) circuits 286 (e.g., VBW circuits 186, FIG. 1) coupled between the combining node structure 264 and a ground reference. In the embodiments illustrated in FIGS. 2 and 3, the VBW circuit 286 is electrically coupled to node 285 in the shunt-L circuit 280. According to an embodiment, and as indicated by the circuit schematic next to VBW circuit 286, VBW circuit 286 may include a series circuit that includes multiple components, and more specifically that includes a resistor (or resistance), an inductor (or inductance), and a capacitor (or capacitance) coupled in series in any order between node 285 and a ground reference (e.g., layer 428, FIG. 4). In other embodiments, one or more VBW circuits 286 may be coupled to one or more different nodes (e.g., to drain terminal(s) 231, 251, to gate terminal(s) 225, 245, or elsewhere). Multiple VBW circuits may be coupled along multiple points of each amplification path, as well.

In some embodiments, some or all of the components of the VBW circuit 286 may be integrated with or integrally-formed with the die 201, 301, and/or some or all of the components of the VBW circuit 286 may be discrete components that are connected to a top surface of the die 201, 301. Alternatively, only some of the components of the VBW circuit 286 (e.g., the resistor and/or inductor) may be integrally-formed with or connected to the die 201, 301, while other components (e.g., the capacitor) may be implemented off-chip and electrically connected through conductive connections (e.g., wirebonds). In other embodiments, substantially all of the VBW circuit may be implemented off-chip (i.e., all or portions of the VBW circuit 296 may be provided with circuitry that is not integrated with die 201, 301). For example, in an alternate embodiment, node 285 may be electrically connected to lead 287 (e.g., through wirebonds, as shown), and all or portions of the VBW circuit 286 (i.e., at least one of the resistance, inductance, and/or capacitance of the VBW circuit) may be implemented with external circuitry coupled to lead 287.

Doherty power amplifier ICs 200, 300, and more specifically dies 201, 301, may be packaged and/or incorporated into a larger electrical system in a variety of ways. For example, Doherty dies 201, 301 may be packaged within an overmolded or air-cavity power device package (e.g., package 504, FIG. 5). Alternatively, Doherty dies 201, 301 may be packaged in a surface-mount type of package, such as a no-leads package (e.g., a dual-flat no leads (DFN) or quad-flat no leads (QFN) package). In still other embodiments, Doherty dies 201, 301 may be mounted directly to a module or PCB substrate surface.

Figure 5:
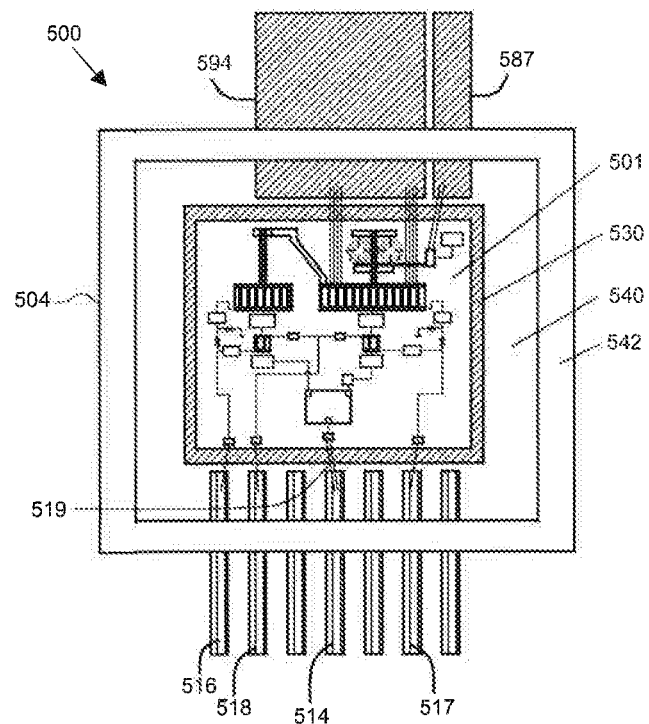
FIG. 5 is a top view of a Doherty amplifier device packaged in a high-power package, in accordance with an example embodiment.

By way of example, FIG. 5 is a top view of a Doherty amplifier device 500 that includes a Doherty die 501 (e.g., die 201 or 301, FIGS. 2, 3) packaged in a high-power, discrete device package 504, in accordance with an example embodiment. Die 501 includes the following integrated circuitry: a main amplifier (e.g., main amplifier 220, FIGS. 2, 3), a peaking amplifier (e.g., peaking amplifier 240, FIGS. 2, 3), a phase shifter/impedance inverter circuit (e.g., phase shifter/impedance inverter 260, FIGS. 2, 3), a combining node structure (e.g., combining node structure 264, FIGS. 2, 3), and a shunt-L circuit (e.g., shunt-L circuit 280, FIGS. 2, 3). In some embodiments, die 501 also may include an integrated signal splitter (e.g., signal splitter 204, FIG. 2) and/or a VBW circuit (e.g., VBW circuit 286, FIGS. 2, 3), while in other embodiments, the signal splitter and/or VBW circuit may be implemented off-die and/or outside of device 500.

Package 504 includes a plurality of conductive input signal and bias leads 514, 516, 517, 518 (e.g., leads 214, 216, 217, 218, 314, 315) and at least one output lead 594 (e.g., lead 294, FIGS. 2, 3). In some embodiments, package 504 also may include one or more additional bias or other leads. For example, package 504 may include a VBW lead 587 (e.g., lead 287, FIGS. 2, 3) that facilitates electrical connection of the die 501 with one or more components of a VBW circuit mounted to a PCB or other substrate (not shown) to which the package 504 is mounted. The input signal and bias leads 514, 516, 517, 518 are positioned at an input side of the package 504, and the at least one output lead 594 and VBW lead 587 (if included) are positioned at an output side of the package 504. The input side (e.g., input side 210, FIGS. 2, 3) of the Doherty die 501 is proximate to and parallel with the input side of the device package 504, in an embodiment.

According to an embodiment, package 504 includes a package substrate, such as a conductive flange 530, to which Doherty die 501 is physically and electrically connected (e.g., with conductive epoxy, solder, brazing, sintering, or other conductive connection methods). Finally, package 504 includes non-conductive structural features or materials, such as molding compound and/or other insulating materials, which hold the leads 514, 516, 517, 518, 587, 594 and the flange 530 in fixed orientations with respect to each other.

Electrically conductive connections, such as conductive wirebonds, electrically connect input signal and bias voltage bond pads (or terminals) on die 501 to the conductive leads 514, 516, 517, 518 on the input side of the package 504. For example, one or more first wirebonds 519 may electrically connect an input RF signal lead 514 to a first bondpad corresponding to an input terminal (e.g., input terminal 202, FIG. 2), and the input RF signal lead 514 may be used to convey an input RF signal to the Doherty die 501. In an alternate embodiment in which the signal splitter (e.g., splitter 204, FIG. 2) is not implemented in die 501, separate leads (e.g., leads 314, 315, FIG. 3) may be used to provide main and peaking RF signals to two bondpads on die 501, where a first bondpad corresponds to an input terminal for the main amplifier (e.g., input terminal 302, FIG. 2), and a second bondpad corresponds to an input terminal for the peaking amplifier (e.g., input terminal 302', FIG. 2). As discussed previously in conjunction with FIG. 2, bias circuits (e.g., bias circuits 270, 270', 277, FIGS. 2, 3) on Doherty die 501 may be electrically connected through additional wirebonds (not numbered) to bias leads 516-518 (e.g., bias leads 216-218, FIGS. 2, 3). According to an embodiment, the output of Doherty die 501 (and more specifically the combining node structure 264, FIGS. 2, 3) is electrically connected to the output lead 594 through a plurality of wirebonds (e.g., wirebonds 290, FIGS. 2-4).

In some embodiments, leads 514, 516-518, 587, 594 and flange 530 may form portions of a lead frame. To complete an overmolded package during device manufacturing, after attachment of die 501 and interconnection of wirebonds between the leads and the die 501, the die 501, the interior ends of leads 514, 516-518, 587, 594, the wirebonds, and the upper and side surfaces of flange 530 may be encapsulated with a non-conductive (e.g., plastic) molding compound 540, 542 (only partially shown in FIG. 5 to avoid obscuring the interior components of device 500). The molding compound 540, 542 defines the perimeter of the device 500 from which leads 514, 516-518, 587, 594 protrude, and also defines the top surface of the device 500. The bottom surface of the device 500 is defined partially by the molding compound 540, and partially by the bottom surface of flange 530. Accordingly, when appropriately coupled to a system substrate (e.g., PCB 610, FIG. 6), flange 530 may function to convey a ground reference to the die 501 (e.g., through the bottom conductive layer 428, FIG. 4), and also may function as a heat sink for the device 500.

In a similar but different embodiment, leads 514, 516-518, 587, 594 with the configurations shown in FIG. 5 may be replaced with lands of a no-leads package. The flange 530 and lands again may form a lead frame to which the die 501 and wirebonds are attached, and again the assembly may be encapsulated with a non-conductive molding compound to form a no-leads, surface mount device (e.g., a DFN or QFN device).

In other embodiments, package 504 may be an air-cavity package. In such an embodiment, flange 530 may have a larger perimeter, which is equal or approximately equal to the perimeter of the device 500. A non-conductive insulator (e.g., ceramic, plastic, or another material) with a frame shape may be attached to the top surface of the flange, leads 514, 516-518, 587, 594 may be placed over the non-conductive insulator, wirebonds are attached, and a cap (not illustrated) is placed over the frame opening to encase the interior components of the device 500 in an air cavity.

Although FIG. 5 shows a Doherty amplifier device 500 that includes a single Doherty amplifier die 501 and corresponding leads, other embodiments of Doherty amplifier devices may include multiple Doherty amplifier dies (e.g., multiple instances of die 201, 301, 501) placed side-by-side, with corresponding sets of leads associated with each die. Using such a device, the output RF signals from the multiple Doherty amplifier dies could be combined (e.g., on the PCB to which the Doherty amplifier device is coupled), for example, using a 3-dB coupler or other means.

Figure 6:
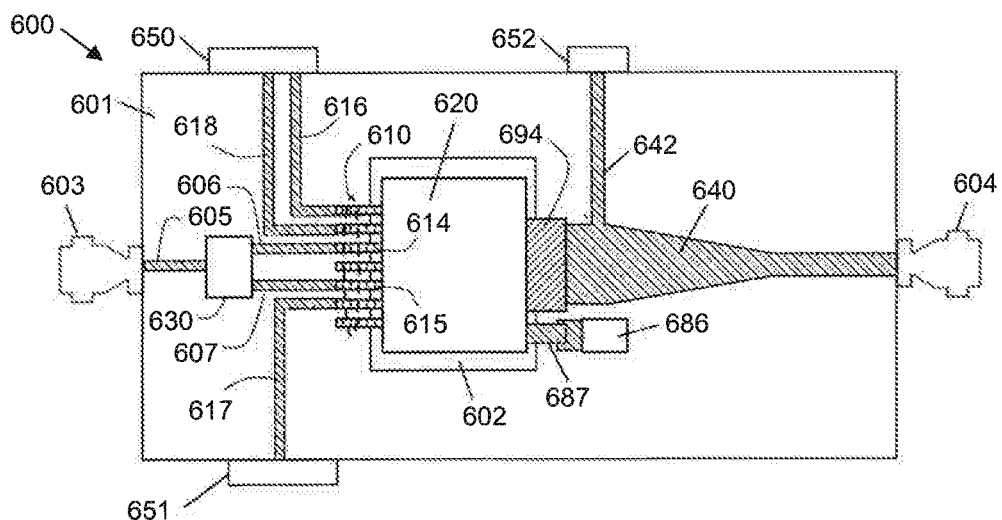
FIG. 6 is a top view of a packaged Doherty amplifier device coupled to a printed circuit board substrate, in accordance with an example embodiment.

Ultimately, Doherty amplifier device 500 is incorporated into a larger electrical system (e.g., a power transmitter lineup in a cellular base station). For example, as illustrated in FIG. 6, a Doherty amplifier device 620 (e.g., device 500, FIG. 5) may be incorporated into amplifier system 600 by coupling the Doherty amplifier device 620 to a system substrate, such as a single-layer or multi-layer PCB 601. The Doherty amplifier device 620 includes a plurality of input-side leads 610 and an output lead 694 (e.g., lead 294, 594, FIGS. 2-5), in an embodiment, which are configured to convey bias voltages and RF signals between conductive features of the PCB 601 and a die (e.g., die 201, 301, FIGS. 2, 3) enclosed within the device 620.

PCB 601 may be a single-layer or multi-layer PCB, and a plurality of elements are coupled to the PCB 601, in an embodiment. According to an embodiment, a conductive coin 602 (or other feature) is embedded within the PCB 601, and top and bottom surfaces of the conductive coin 602 are exposed at top and bottom surfaces, respectively, of the PCB 601. Doherty amplifier device 620 (e.g., device 500, FIG. 5) is connected to the conductive coin 602. More specifically, the bottom surface (e.g., the bottom of flange 530, FIG. 5) of the Doherty amplifier device 620 may be physically and electrically connected to the top surface of the conductive coin 602. The conductive coin 602, in turn, may be electrically connected to system ground, and a bottom surface of the coin 602 may be physically connected to a system heat sink. Accordingly, the conductive coin 602 may function as a ground reference and a heat sink for the amplifier system 600.

In a typical configuration, the amplifier system 600 includes an input RF connector 603 and an output RF connector 604 coupled to the PCB 601, which are configured, respectively, to receive an input RF signal from an RF signal source, and to produce an amplified output RF signal for transmission to a load (e.g., to load 196, FIG. 1, which may be a cellular antenna coupled to connector 604).

The PCB 601 includes a plurality of conductive paths 605, 606, 607, 640 that are electrically coupled between the input and output RF connectors 603, 604 and the Doherty amplifier device 620. Additional conductive paths 616, 617, 618, 642 may be used to convey DC gate and drain bias voltages from bias voltage connectors 650, 651, 652 to the device 620. For example, the conductive paths and features 605-607, 616-618, 640, 642 may be formed from patterned portions of a top conductive layer, a bottom conductive layer, and/or interior conductive layer(s) (if included) of the PCB 601.

In the illustrated embodiment, a first conductive path 605 electrically connects the input RF connector 603 to an input of signal splitter 630, which is configured to split an input RF signal conveyed through path 605 into first and second RF signals (e.g., corresponding to main and peaking input RF signals). The first and second RF signals are produced at two outputs of signal splitter 630, and the signals are conveyed to first and second RF input leads 614, 615 of Doherty amplifier device 620 through second and third conductive paths 606, 607, respectively. According to an embodiment, signal splitter 630 produces the first and second RF signals so that they have about 90 degrees of phase difference. In other embodiments, the phase difference may be imparted by circuitry that is distinct from the signal splitter 630.

The Doherty amplifier device 620 in the illustrated embodiment corresponds to a device that includes a Doherty amplifier die (e.g., Doherty amplifier die 301, FIG. 3) that does not include an integrated signal splitter (e.g., splitter 204, FIG. 2). Instead, in the illustrated embodiment, the signal splitter 630 is utilized to split an input RF signal into the first and second (e.g., main and peaking) RF signals. In alternate embodiments, a Doherty amplifier device 620 may include a Doherty amplifier die (e.g., Doherty die 201, FIG. 2) that does include an integrated signal splitter (e.g., splitter 204, FIG. 2), in which case signal splitter 630 may be excluded from the system 600, and the input RF connector 603 may be directly connected to a single input lead (e.g., lead 214, 614) through a single conductive path.

As discussed in detail above, a Doherty amplifier die (e.g., die 201, 301, 501, FIGS. 2-5) within the Doherty amplifier device 620 amplifies the input RF signal(s) to produce an amplified output RF signal at output lead 694 (e.g., lead 294, 594, FIGS. 2-5). An additional conductive path 640 on the PCB 601 electrically connects the output RF signal lead 694 of the Doherty amplifier device 620 to the output RF connector 604. Accordingly, the amplified RF signal produced by the Doherty amplifier device 620 is conveyed to the output RF connector 604 through conductive path 640 during operation of the system 600.

As discussed previously, the Doherty amplifier die (e.g., die 201, 301, 501, FIGS. 2-5) may or may not include an integrated VBW circuit (e.g., VBW circuit 286, FIGS. 2, 3). In the embodiment illustrated in FIG. 6, the Doherty amplifier die within Doherty amplifier device 620 does not include an integrated VBW circuit. Instead, Doherty amplifier device 620 includes a VBW lead 687 (e.g., VBW lead 287, 587, FIGS. 2-5), and a VBW circuit 686 implemented on the PCB 601. For example, the VBW circuit 686 may include a resistor, an inductor, and a capacitor coupled in series between VBW lead 687 and a ground reference.

Figure 7:
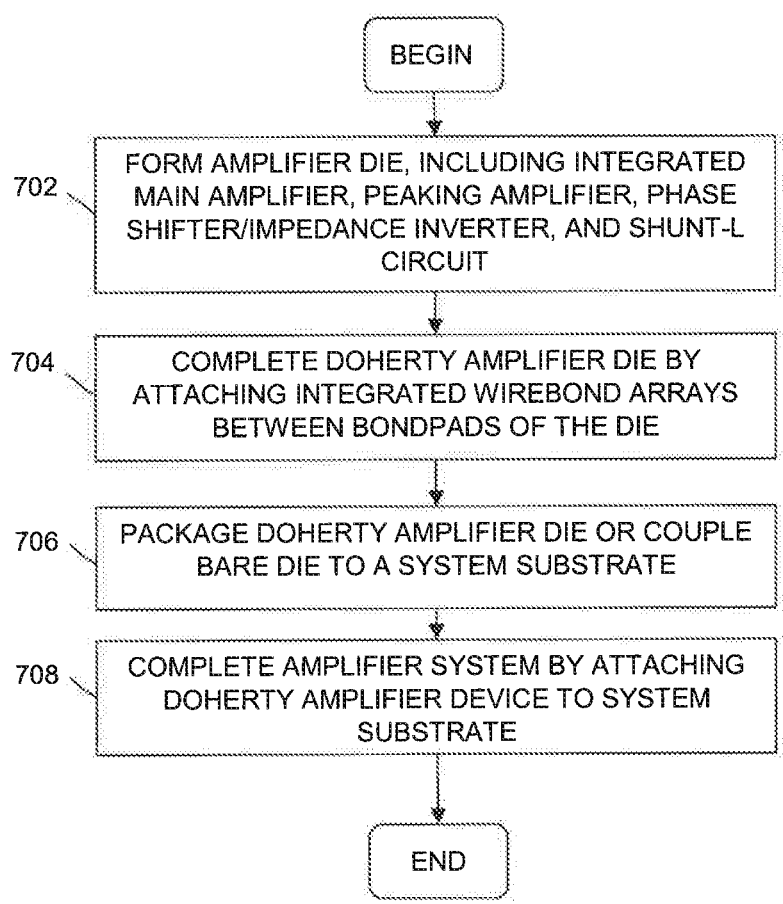
FIG. 7 is a flowchart of a method of making a Doherty power amplifier IC, and a packaged Doherty amplifier device, in accordance with an example embodiment.

FIG. 7 is a flowchart of a method of making a Doherty power amplifier die (e.g., Doherty amplifier die 201, 301, 501, FIGS. 2-5), a packaged Doherty amplifier device (e.g., device 500, FIG. 5), and a Doherty amplifier system (e.g., system 600, FIG. 6), in accordance with an example embodiment. The method may begin, in block 702, by forming an amplifier die (e.g., die 201, 301, 501, FIGS. 2-5), which includes an integrated main amplifier (e.g., main amplifier 220, FIGS. 2, 3), an integrated peaking amplifier (e.g., peaking amplifier 240, FIGS. 2, 3), an integrated phase shifter/impedance inverter circuit (e.g., phase shifter/impedance inverter 260, FIGS. 2, 3), an integrated combining node structure (e.g., combining node structure 264, FIGS. 2, 3), and an integrated shunt-L circuit (e.g., shunt-L circuit 280, FIGS. 2, 3). In addition, forming the amplifier die may include integrally-forming or integrating a power splitter (e.g., splitter 204, FIG. 2), matching networks (e.g., IMN 222, 242, ISMN 228, 248, FIGS. 2, 3), bias circuits (e.g., bias circuits 270, 270', 277, FIGS. 2, 3), VBW circuit(s) (e.g., VBW circuit 286, FIGS. 2, 3), and/or other integrated components. In alternate embodiments, some of the circuits and components in the previous sentence may be implemented on substrates that are distinct from the amplifier die.

In block 704, the Doherty amplifier die (e.g., Doherty amplifier die 201, 301, 501, FIGS. 2-5) is completed by coupling integrated wirebonds (e.g., wirebonds 261, 282, FIGS. 2, 3) between bonding pads of the die, and/or coupling discrete components to the top surface of the die.

The Doherty amplifier die (e.g., Doherty amplifier die 201, 301, 501, FIGS. 2-5) may then be packaged in block 706. As mentioned previously, the Doherty amplifier die may be packaged in an overmolded or air-cavity package. Alternatively, the Doherty amplifier die may be attached as a bare die to a system substrate (e.g., a module or PCB substrate). When packaged in an overmolded package (e.g., package 504, FIG. 5), the Doherty amplifier die may be connected to a conductive flange of a leadframe, wirebonds may be coupled between input, output, and bias leads of the leadframe and appropriate bond pads of the Doherty amplifier die, and the flange, leads, and Doherty amplifier die may be encapsulated in molding compound. When packaged in an air-cavity package, an insulator frame may be attached to the top surface of a conductive flange, the Doherty amplifier die may be connected to the top surface of the flange in the frame opening, input, output, and bias leads may be connected to the top surface of the insulator frame, wirebonds may be coupled between the input, output, and bias leads and appropriate bond pads of the Doherty amplifier die, and a cap may be applied over the flange, insulator frame, leads, wirebonds, and Doherty amplifier die to encase the Doherty amplifier die in an air cavity.

In block 708, the amplifier system (e.g., system 600, FIG. 6) may be completed by attaching the Doherty amplifier device (e.g., device 500, FIG. 5) (or in some embodiments the bare die) to a system substrate, such as a PCB (e.g., PCB 601, FIG. 6). More specifically, the bottom surface of the Doherty amplifier device may be connected to a conductive coin (e.g., coin 602, FIG. 6) to provide a ground reference and heat sink to the device, and the device's input, output, and bias leads may be connected to corresponding conductive paths (e.g., paths 605-607, 616-618, 640, FIG. 6) of the system substrate.

According to an embodiment, additional components (e.g., splitter 630 and/or VBW circuit 686, FIG. 6) may be coupled to the system substrate (e.g., PCB 601, FIG. 6), in block 710, to complete the amplifier system. The method may then end.

Embodiments include a multiple-path amplifier that includes a semiconductor die, a first transistor integrally-formed with the semiconductor die, a second transistor integrally-formed with the semiconductor die, a combining node structure integrally-formed with the semiconductor die, and a shunt-inductance circuit. Outputs of the first and second transistors are electrically coupled to the combining node structure. The shunt-inductance circuit is electrically coupled between the combining node structure and a ground reference node, and the shunt-inductance circuit includes a shunt inductance that is integrated with the semiconductor die.

According to a further embodiment, the shunt-inductance circuit includes a first integrated inductance that includes a set of wirebonds, where each wirebond of the set of wirebonds has first and second ends connected to first and second bondpads, respectively, that are exposed at a top surface of the semiconductor die. According to another further embodiment, the shunt-inductance circuit further includes a second integrated inductance that includes one or more spiral inductors that are integrally-formed with the semiconductor die, and that are coupled in series with the first integrated inductance between the combining node structure and the ground reference node.

According to another further embodiment, the shunt inductance and the second drain-source capacitance resonate at a frequency that is below a band of operation of the multi-path amplifier.

According to another further embodiment, the multi-path amplifier further includes an integrated phase shifter/impedance inverter coupled between the outputs of the first and second transistors, where the integrated phase shifter/impedance inverter is configured to impart a 90-degree phase delay between intrinsic drains of the first and second transistors.

Additional embodiments include a Doherty amplifier with a main amplifier transistor, a peaking amplifier transistor integrally-formed with a semiconductor die, a combining node structure integrally-formed with the semiconductor die, and a shunt-inductance circuit electrically coupled between the combining node structure and a ground reference node. Drain terminals of the main and peaking transistors are electrically coupled to the combining node structure, and the shunt-inductance circuit includes a shunt inductance that is integrated with the semiconductor die.

According to a further embodiment, the shunt inductance includes one or more components integrated with the semiconductor die, where the one or more components is selected from a set of integrated wirebonds, one or more integrated spiral inductors, and one or more discrete inductors coupled to a top surface of the semiconductor die.

According to another further embodiment, the main amplifier transistor is integrally-formed with the semiconductor die, and the Doherty amplifier further includes an integrated phase shifter/impedance inverter coupled between the outputs of the main amplifier transistor and the peaking amplifier transistor, where the integrated phase shifter/impedance inverter is configured to impart a 90 degree phase delay between intrinsic drains of the main amplifier transistor and the peaking amplifier transistor.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A multiple-path amplifier comprising:
a semiconductor die comprising a base semiconductor substrate formed from a semiconductor material;
a first transistor integrally-formed with the semiconductor die;
a second transistor integrally-formed with the semiconductor die;
a combining node structure integrally-formed with the semiconductor die, wherein outputs of the first and second transistors are electrically coupled to the combining node structure; and
a shunt-inductance circuit electrically coupled between the combining node structure and a ground reference node, wherein the shunt-inductance circuit includes a shunt inductance that is integrated with the semiconductor die.

2. The multiple-path amplifier of claim 1, wherein the combining node structure is closely electrically coupled to the output of the second transistor.

3. The multiple-path amplifier of claim 1, wherein the shunt-inductance circuit comprises:
a first integrated inductance that includes a set of wirebonds, wherein each wirebond of the set of wirebonds has first and second ends connected to first and second bondpads, respectively, that are exposed at a top surface of the semiconductor die.

4. The multiple-path amplifier of claim 3, wherein the shunt-inductance circuit further comprises:
a second integrated inductance that includes one or more spiral inductors that are integrally-formed with the semiconductor die, and that are coupled in series with the first integrated inductance between the combining node structure and the ground reference node.

5. The multiple-path amplifier of claim 1, wherein the shunt-inductance circuit comprises:
one or more integrated inductances; and
a capacitor electrically connected between the one or more integrated inductances and the ground reference node.

6. A multiple-path amplifier comprising:
a semiconductor die;
a first transistor integrally-formed with the semiconductor die;
a second transistor integrally-formed with the semiconductor die;
a combining node structure integrally-formed with the semiconductor die, wherein outputs of the first and second transistors are electrically coupled to the combining node structure;
a shunt-inductance circuit electrically coupled between the combining node structure and a ground reference node, wherein the shunt-inductance circuit includes a shunt inductance that is integrated with the semiconductor die;
a radio frequency (RF) cold point between the one or more integrated inductances and the capacitor; and
a video bandwidth circuit electrically coupled to the RF cold point node.

7. The multiple-path amplifier of claim 6, wherein the video bandwidth circuit comprises:
a resistance, an inductance, and a capacitance coupled in series.

8. The multiple-path amplifier of claim 7, wherein at least one of the resistance, the inductance, and the capacitance is integrated with the semiconductor die.

9. The multiple-path amplifier of claim 7, wherein at least one of the resistance, the inductance, and the capacitance is implemented off-chip and electrically coupled through wirebonds to the RF cold point node.

10. The multiple-path amplifier of claim 1, wherein the second transistor is larger than the first transistor, and the first transistor has a first drain-source capacitance, CdsM, that is smaller than a second drain-source capacitance, CdsP, of the second transistor.

11. The multiple-path amplifier of claim 10, wherein the shunt inductance and the second drain-source capacitance resonate at a frequency that is below a band of operation of the multiple-path amplifier.

12. The multiple-path amplifier of claim 1, further comprising:
an integrated phase shifter/impedance inverter coupled between the outputs of the first and second transistors, wherein the integrated phase shifter/impedance inverter is configured to impart a 90-degree phase delay between intrinsic drains of the first and second transistors.

13. The multiple-path amplifier of claim 12, wherein the integrated phase shifter/impedance inverter comprises:
a set of wirebonds, wherein each wirebond of the set of wirebonds has first and second ends connected to first and second bondpads, respectively, that are exposed at a top surface of the semiconductor die.

14. The multiple-path amplifier of claim 13, wherein the integrated phase shifter/impedance inverter further comprises:
a transmission line integrally-formed with the semiconductor die and coupled in series with the set of wirebonds.

15. A multiple-path amplifier comprising:
a semiconductor die;
a first transistor integrally-formed with the semiconductor die;
a second transistor integrally-formed with the semiconductor die;

a combining node structure integrally-formed with the semiconductor die, wherein outputs of the first and second transistors are electrically coupled to the combining node structure; and a shunt-inductance circuit electrically coupled between the combining node structure and a ground reference node, wherein the shunt-inductance circuit includes a shunt inductance that is integrated with the semiconductor die, wherein the second transistor is larger than the first transistor, and the shunt inductance is configured to reduce a difference between a drain-source capacitance of the first transistor and an effective drain-source capacitance of the second transistor.

16. A multiple-path amplifier comprising:

a semiconductor die;

a first transistor integrally-formed with the semiconductor die;

a second transistor integrally-formed with the semiconductor die;

a combining node structure integrally-formed with the semiconductor die, wherein outputs of the first and second transistors are electrically coupled to the combining node structure; and a shunt-inductance circuit electrically coupled between the combining node structure and a ground reference node, wherein the shunt-inductance circuit includes a shunt inductance that is integrated with the semiconductor die, wherein the semiconductor die comprises a base semiconductor substrate having bulk resistivity in a range of about 1000 ohm/centimeter (cm) to about 100,000 ohm/cm or greater.

17. A Doherty amplifier comprising:

a main amplifier transistor integrally formed within a semiconductor die, wherein the semiconductor die comprises a base semiconductor substrate formed from a semiconductor material;

a peaking amplifier transistor integrally-formed with the semiconductor die;

a combining node structure integrally-formed with the semiconductor die, wherein drain terminals of the main and peaking transistors are electrically coupled to the combining node structure; and a shunt-inductance circuit electrically coupled between the combining node structure and a ground reference node, wherein the shunt-inductance circuit includes a shunt inductance that is integrated with the semiconductor die.

18. The Doherty amplifier of claim 17, wherein the shunt inductance comprises one or more components integrated with the semiconductor die, wherein the one or more components is selected from a set of integrated wirebonds, one or more integrated spiral inductors, and one or more discrete inductors coupled to a top surface of the semiconductor die.

19. The Doherty amplifier of claim 17, wherein the shunt-inductance circuit comprises:

one or more integrated inductances; and a capacitor electrically connected between the one or more integrated inductances and the ground reference node.

20. The Doherty amplifier of claim 19, further comprising:

a radio frequency (RF) cold point between the one or more integrated inductances and the capacitor; and a video bandwidth circuit electrically coupled to the RF cold point node.

21. The Doherty amplifier of claim 17, wherein the Doherty amplifier further comprises:

an integrated phase shifter/impedance inverter coupled between the outputs of the main amplifier transistor and the peaking amplifier transistor, wherein the integrated phase shifter/impedance inverter is configured to impart a 90-degree phase delay between intrinsic drains of the main amplifier transistor and the peaking amplifier transistor.

22. The Doherty amplifier of claim 17, further comprising:

a signal splitter integrated with the semiconductor die, wherein the signal splitter is configured to divide power of an input radio frequency (RF) signal into a main input signal that is provided to the main amplifier transistor and a peaking input signal that is provided to the peaking amplifier transistor.

* * * * *